(12) United States Patent
Higuchi et al.

(10) Patent No.: US 9,415,968 B2
(45) Date of Patent: Aug. 16, 2016

(54) COMPONENT SUPPLYING APPARATUS AND COMPONENT SUPPLYING METHOD

(71) Applicant: Panasonic Corporation, Osaka (JP)

(72) Inventors: Motohiro Higuchi, Nara (JP); Minoru Kitani, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/267,073

(22) Filed: May 1, 2014

(65) Prior Publication Data
US 2014/0367049 A1  Dec. 18, 2014

(30) Foreign Application Priority Data

Jun. 14, 2013 (JP) ................................. 2013-125768
Feb. 14, 2014 (JP) ................................. 2014-026941

(51) Int. Cl.
| | |
|---|---|
| *B65H 37/00* | (2006.01) |
| *B32B 43/00* | (2006.01) |
| *H05K 13/04* | (2006.01) |
| *H05K 13/02* | (2006.01) |

(52) U.S. Cl.
CPC ............ *B65H 37/002* (2013.01); *B32B 43/006* (2013.01); *H05K 13/021* (2013.01); *H05K 13/0408* (2013.01); *H05K 13/0417* (2013.01); *B32B 2457/00* (2013.01); *B65H 2301/51122* (2013.01); *B65H 2701/1942* (2013.01); *Y10T 156/1195* (2015.01); *Y10T 156/1967* (2015.01)

(58) Field of Classification Search
CPC ............ H05K 13/0417; H05K 13/021; H05K 13/0408
See application file for complete search history.

(56) References Cited

U.S. PATENT DOCUMENTS

| | | | |
|---|---|---|---|
| 6,474,527 B2 * | 11/2002 | Miller | 226/32 |
| 6,773,542 B2 * | 8/2004 | Bergstrom et al. | 156/701 |
| 7,131,478 B2 * | 11/2006 | Endo et al. | 156/247 |
| 7,713,376 B2 | 5/2010 | Larsson et al. | |
| 7,930,819 B2 * | 4/2011 | Yonemitsu et al. | 29/739 |
| 8,764,935 B2 * | 7/2014 | Kinoshita et al. | 156/714 |
| 8,999,108 B2 * | 4/2015 | Nagao et al. | 156/714 |
| 2004/0149383 A1 * | 8/2004 | Bergstrom | 156/344 |
| 2007/0241028 A1 * | 10/2007 | Larsson et al. | 206/714 |
| 2011/0243695 A1 * | 10/2011 | Hwang et al. | 414/412 |
| 2014/0346212 A1 * | 11/2014 | Kawaguchi et al. | 226/76 |

* cited by examiner

*Primary Examiner* — Mark A Osele
(74) *Attorney, Agent, or Firm* — Wenderoth, Lind & Ponack, L.L.P.

(57) ABSTRACT

A component supplying apparatus has a tape guide part for guiding a carrier tape, a blade for entering between a top tape and a base tape, and a first tape press part for facing the carrier tape on an upstream side of a top tape removing position. A first biasing part biases the first tape press part to have the carrier tape held between the tape guide part and the first tape press part and to attain positioning of the carrier tape in thickness direction thereof. A sprocket wheel wedges the carrier tape between the tape guide part and the first tape press part, and a second biasing part presses the carrier tape against the tape guide part by a second tape press part.

7 Claims, 15 Drawing Sheets

COMPONENT SUPPLYING APPARATUS AND COMPONENT SUPPLYING METHOD

CROSS-REFERENCE TO RELATED APPLICATIONS

This application is an application claiming priorities to Japanese Patent Applications Nos. 2013-125768 and 2014-026941, these contents of which are incorporated herein by reference.

BACKGROUND OF THE INVENTION

1. Technical Field

The present invention relates to a component supplying apparatus and a component supplying method for supplying components onto nozzles of a transfer head of a component mounting apparatus.

2. Background Art

Conventionally, a carrier tape has been used for supplying components onto nozzles of a transfer head of a component mounting apparatus. The carrier tape includes a base tape in which a plurality of depressed or embossed recesses accommodating components are arranged in a tape length direction and a top tape which is pasted on the base tape so as to cover the plurality of recesses having the components accommodated therein. The top tape is removed from the base tape so that the components in the recesses of the carrier tape can be sucked by the nozzles of the transfer head of the component mounting apparatus.

Patent document 1 discloses that the removing of the top tape from the base tape is carried out with use of a blade having an edge, for instance. Specifically, the blade is placed on a tape path of the carrier tape that is fed in the tape length direction. The edge of the blade enters between the base tape and the top tape in the tape length direction from front end side of the carrier tape that is moving, and the top tape is thereby removed from the base tape. A component supplying apparatus disclosed in Patent document 1 is configured so as to remove from the base tape a portion of the top tape on one side of the tape width direction.

Patent Document 1: U.S. Pat. No. 7,713,376

In recent years, a component supplying apparatus that allows a plurality of types of carrier tapes to be used has been demanded.

In a component supplying apparatus having a configuration that allows use of a plurality of types of carrier tapes, however, there is a possibility that a carrier tape of a particular type, such as a carrier tape that is thin or that has a tendency to curl, may run on teeth of a sprocket wheel and that defective feeding of the carrier tape may consequently be caused on a tape path.

SUMMARY OF THE INVENTION

It is an object of the invention to stably secure an engagement between teeth of a sprocket wheel and feed holes of a plurality of types of carrier tapes, in particular, feed holes of a carrier tape that is thin or that has a tendency to curl, for instance, and to suppress occurrence of defective feeding of the carrier tapes.

In order to achieve the above object, according to a first aspect of present invention, there is provided a component supplying apparatus for feeding in a tape length direction a carrier tape having a base tape having recesses for accommodating components and a top tape pasted on the base tape so as to cover the recesses while removing the top tape from the carrier tape, the component supplying apparatus comprising:

a tape guide part for facing a reverse surface of the base tape that is opposed to a main surface on which the top tape is pasted and guiding the carrier tape toward a top tape removing position, a blade having an edge for entering between the top tape and the base tape from front end side of the carrier tape fed in a tape feeding direction at the top tape removing position, a first tape press part positioned upstream side of the top tape removing position in the tape feeding direction and facing the carrier tape on the tape guide part, a first biasing part for directly or indirectly biasing the first tape press part together with the blade toward the tape guide part, thereby having the carrier tape held between the tape guide part and the first tape press part so as to allow the carrier tape to be moved in the tape feeding direction, the carrier tape entering from the side of an entrance of a facing region where the tape guide part and the first tape press part face each other on a tape path of the carrier tape, and attaining positioning of the carrier tape in a tape thickness direction relative to the edge of the blade biased together with the first tape press part toward the tape guide part, a sprocket wheel for rotating while engaging with feed holes of the carrier tape and thereby wedging the carrier tape in the tape feeding direction into between the tape guide part and the first tape press part that hold the carrier tape, a second tape press part positioned upstream side of the sprocket wheel in the tape feeding direction and on the side of the entrance of the facing region between the tape guide part and the first tape press part that hold the carrier tape, and facing the main surface of the base tape on the tape guide part, and a second biasing part for biasing the second tape press part toward the tape guide part and thereby pressing the carrier tape against the tape guide part so as to allow the carrier tape to be moved in the tape feeding direction.

According to a second aspect, there is provided the component supplying apparatus of the first aspect, wherein the facing region between the tape guide part and the first tape press part includes a tape holding region in which the carrier tape is held between the tape guide part and the first tape press part and a tape introducing region in which distance between the tape guide part and the first tape press part increases from the tape holding region toward the upstream side of the tape feeding direction.

According to a third aspect, there is provided the component supplying apparatus of the second aspect, wherein teeth of the sprocket wheel start to engage with the feed holes of the carrier tape in the tape introducing region of the facing region where the tape guide part and the first tape press part face each other on the tape path and disengage from the feed holes in the tape holding region on downstream side of the tape introducing region in the tape feeding direction.

According to a fourth aspect, there is provided the component supplying apparatus of the first aspect, wherein size in a tape width direction of a portion of the second tape press part that comes into contact with the carrier tape is smaller than a width of the carrier tape. The second tape press part faces the feed holes of the carrier tape and presses the carrier tape against the tape guide part.

According to a fifth aspect, there is provided the component supplying apparatus of the first aspect, wherein the second tape press part is a freely rotatable roller having an outer peripheral surface that comes into contact with the carrier tape.

According to a sixth aspect, there is provided the component supplying apparatus of the first aspect, further comprising a plate-like biasing part placed above the tape guide part. The plate-like biasing part comprises:

a tape facing part that functions as the second tape press part facing the main surface of the base tape on the tape guide part, and a base part that functions as the second biasing part for biasing the tape facing part as the second tape press part toward the tape guide part.

According to a seventh aspect, there is provided the component supplying apparatus of the sixth aspect, wherein a portion of the tape facing part of the plate-like biasing part faces a portion of the main surface of the base tape on at least one side in the tape width direction of the feed holes in which the teeth of the sprocket wheel have entered at least partially.

According to an eighth aspect, there is provided a component supplying method for feeding in a tape length direction a carrier tape having a base tape having recesses for accommodating components and a top tape pasted on the base tape so as to cover recesses while removing the top tape from the carrier tape, the component supplying method comprising:

guiding the carrier tape toward a sprocket wheel for wedging the carrier tape in a tape feeding direction into between a first tape press part and a tape guide part that hold the carrier tape at upstream side of the top tape removing position in the tape feeding direction, while the carrier tape follows the tape guide part with the tape guide part facing a reverse surface of the base tape that is opposed to a main surface on which the top tape is pasted, engaging feed holes of the carrier tape with teeth of the sprocket wheel while pressing the carrier tape against the tape guide part so as to allow the carrier tape to be moved in the tape feeding direction by use of a second tape press part facing the main surface of the base tape on the tape guide part at upstream side of the sprocket wheel in the tape feeding direction and on a side of an entrance of a facing region where the first tape press part and the tape guide part face each other, rotating the sprocket wheel with the teeth engaging with the feed holes of the carrier tape, thereby wedging the carrier tape into between the first tape press part directly or indirectly biased toward the tape guide part and the tape guide part, and thereby attaining positioning of the carrier tape in the tape thickness direction, and making an edge of a blade relatively enter between the top tape and the base tape from front end side of the carrier tape that is moving in the tape feeding direction in a state in which positioning in the tape thickness direction is attained by holding between the first tape press part and the tape guide part.

According to the invention, feed holes of a plurality of types of carrier tapes or feed holes of a carrier tape that is thin or that has a tendency to curl can stably be engaged with the teeth of the sprocket wheel. Accordingly, occurrence of jamming of the carrier tapes can be suppressed.

DETAILED DESCRIPTION OF THE INVENTION

Hereinbelow, an embodiment of the invention will be described with reference to the drawings.

Figure 1:
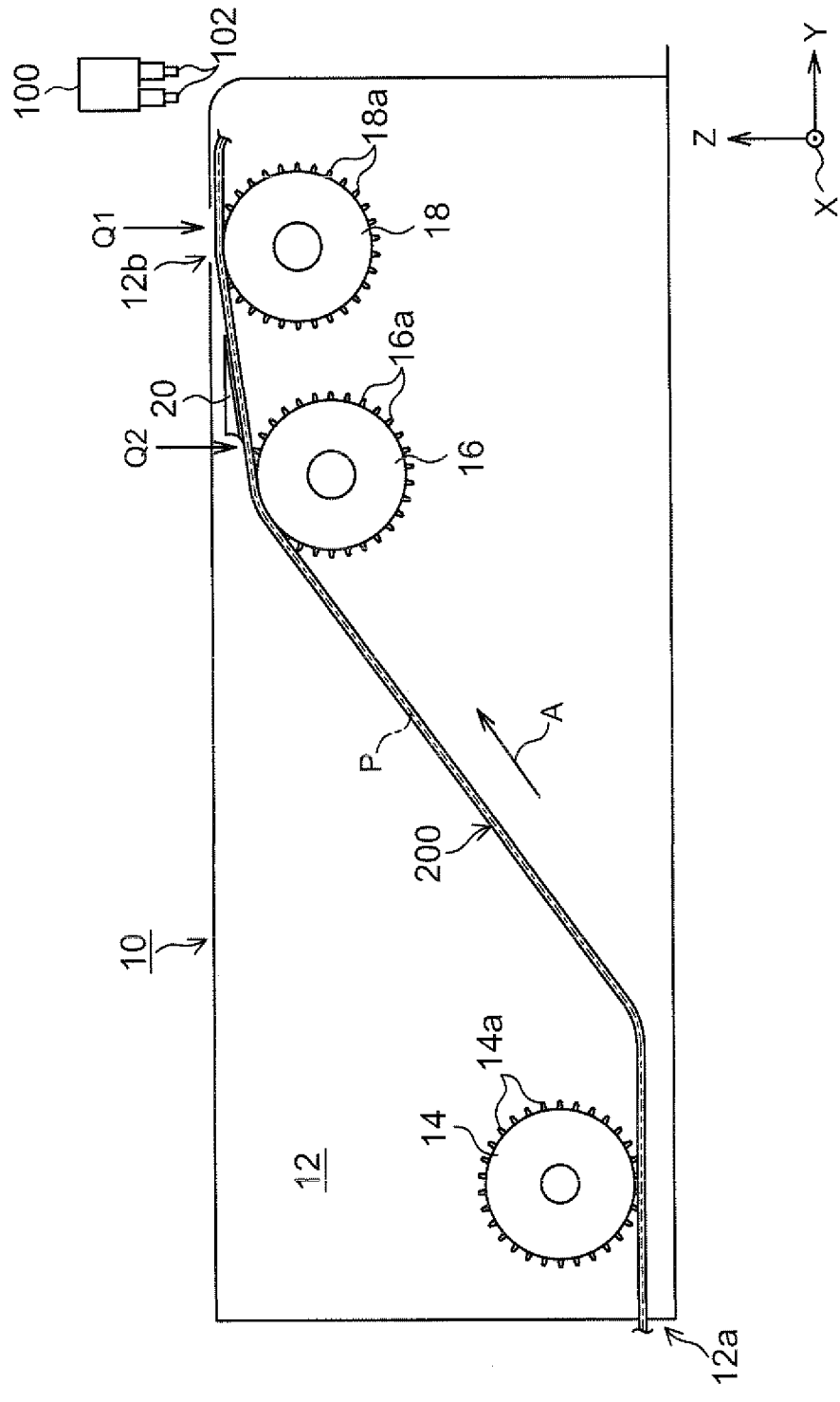
FIG. 1 shows a schematic configuration of a component supplying apparatus in accordance with an embodiment of the invention.

FIG. 1 schematically shows a configuration of a component supplying apparatus in accordance with the embodiment.

The component supplying apparatus 10 in accordance with the embodiment is configured so as to supply components onto nozzles 102 of a transfer head 100 of a component mounting apparatus. Specifically, the component supplying apparatus 10 supplies components onto the nozzles 102 of the transfer head 100 with use of a carrier tape 200 accommodating and holding the components as shown in FIG. 2.

Figure 2:
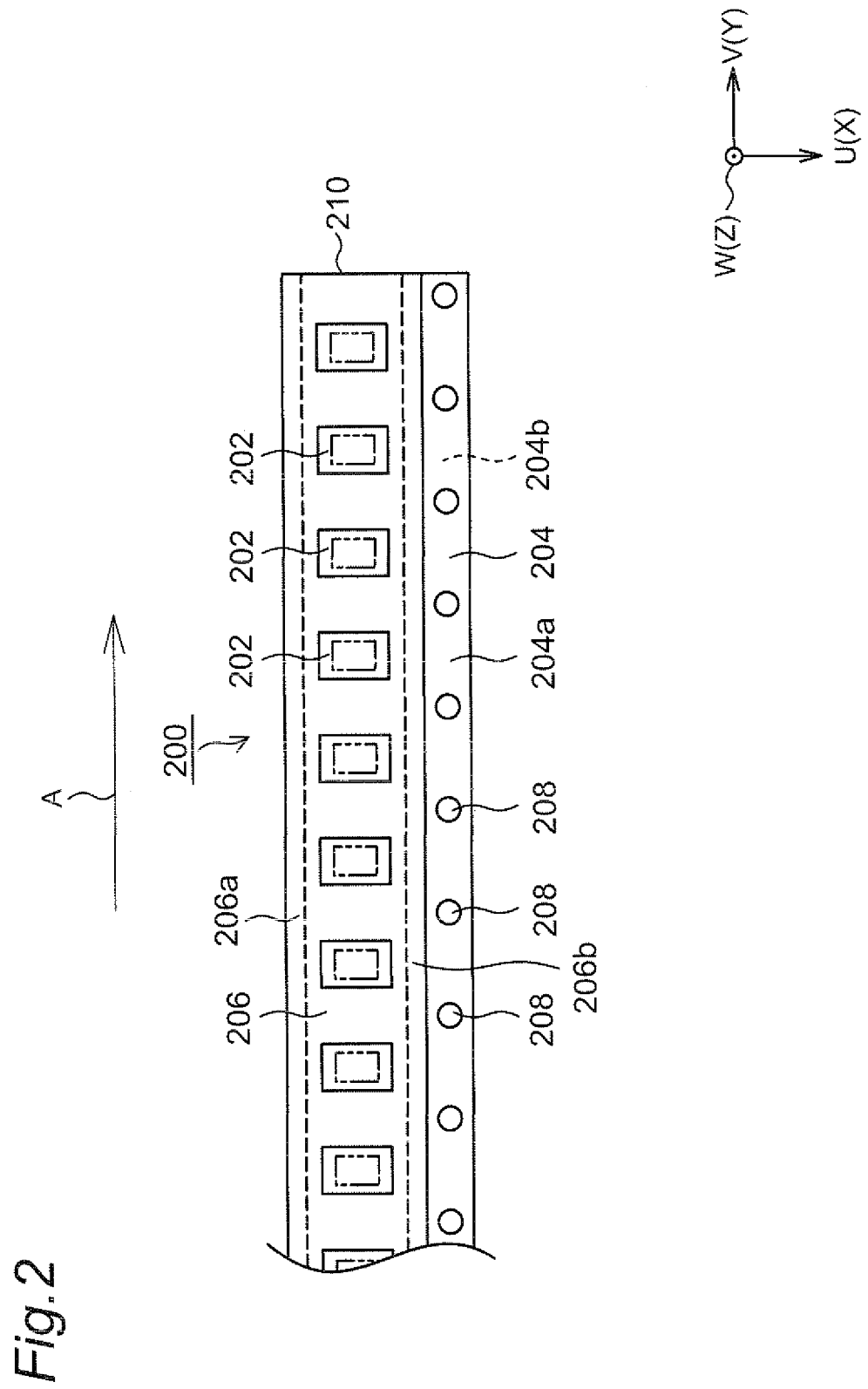
FIG. 2 is a view of a carrier tape as seen in tape thickness direction.

FIG. 2 shows a front end face portion (end face portion that resides on front side when the tape is moving) of the carrier tape 200. In a rectangular coordinate system u-v-w shown in FIG. 2, u-axis direction corresponds to tape width direction, v-axis direction corresponds to tape length direction, and w-axis direction corresponds to tape thickness direction.

As shown in FIG. 2, the carrier tape 200 has a base tape 204 having a plurality of recesses 202 accommodating the components (shown by two-dot chain lines in the drawing), which are to be supplied onto the nozzles 102 of the transfer head 100 of the component mounting apparatus, and arranged in the tape length direction (v-axis direction), and a top tape 206 pasted on the base tape 204 through both end sides thereof in the tape width direction (u-axis direction) so that the top tape 206 covers the recesses 202. The carrier tape 200 has a plurality of feed holes 208 formed on the base tape 204, arranged in the tape length direction, and penetrates in the tape thickness direction (w-axis direction).

As shown in FIG. 2, the top tape 206 is pasted with adhesive or the like on a portion of a main surface 204a of the base tape 204 excluding a portion thereof where the feed holes 208 are formed. Specifically, both end portions 206a, 206b of the top tape 206 excluding the center portion (portion covering the housing parts 202) in the tape width direction (u-axis direction) are pasted on the main surface 204a of the base tape 204.

Returning to FIG. 1, the component supplying apparatus 10 has a body part 12, a tape path P formed in the body part 12, a plurality of sprocket wheels 14-18 for feeding the carrier tape 200 in the tape length direction along the tape path P, and a blade 20 for removing the top tape 206 from the base tape 204.

A tape entering port 12a for entering the carrier tape 200 into the body part 12 is provided at start end (upstream end in a tape feeding direction A) of the tape path P in the body part 12 of the component supplying apparatus 10. The carrier tape 200 enters into the tape entering port 12a in the tape length direction in a state in which the main surface 204a of the base tape 204 having the top tape 206 pasted thereon faces upward.

The component supplying apparatus 10 has a component supply port 12b placed above the tape path P so that the nozzles 102 of the transfer head 100 of the component mounting apparatus can suck the components, therethrough from above, in the recesses 202 of the carrier tape 200 from which the top tape 206 has been removed by the blade 20. That is, the component supply port 12b is provided at a component supply position Q1 where the nozzles 102 of the transfer head 100 suck components.

The plurality of sprocket wheels 14-18 are provided in the tape path P in order to feed the carrier tape 200 along the tape path P in the tape feeding direction A that is the tape length direction. The plurality of sprocket wheels 14-18 rotate with teeth 14a-18a engaging with the feed holes 208 of the carrier tape 200 and thereby feed the carrier tape 200 along the tape path P in the tape feeding direction A toward the component supply port 12b (the component supply position Q1).

The blade 20 partially removes the top tape 206 from the base tape 204 at a top tape removing position Q2 upstream of the component supply position Q1 in the tape feeding direction A so that the nozzles 102 of the transfer head 100 can suck the components at the component supply position Q1. The blade 20 will be described below in detail with reference to FIGS. 3-7.

Figure 3:
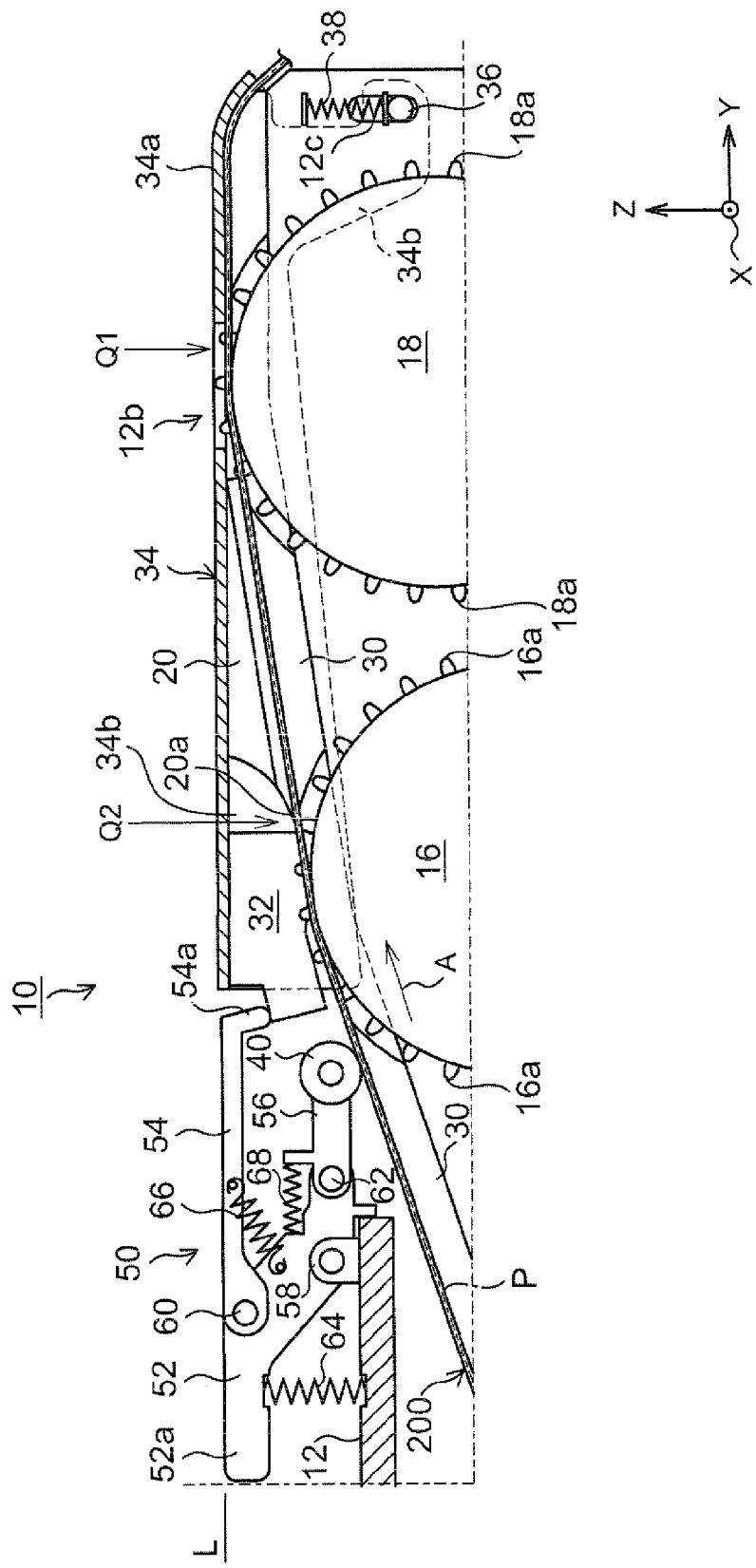
FIG. 3 is a fragmentary enlarged view of the component supplying apparatus including a component supply position and a top tape removing position.
Figure 4:
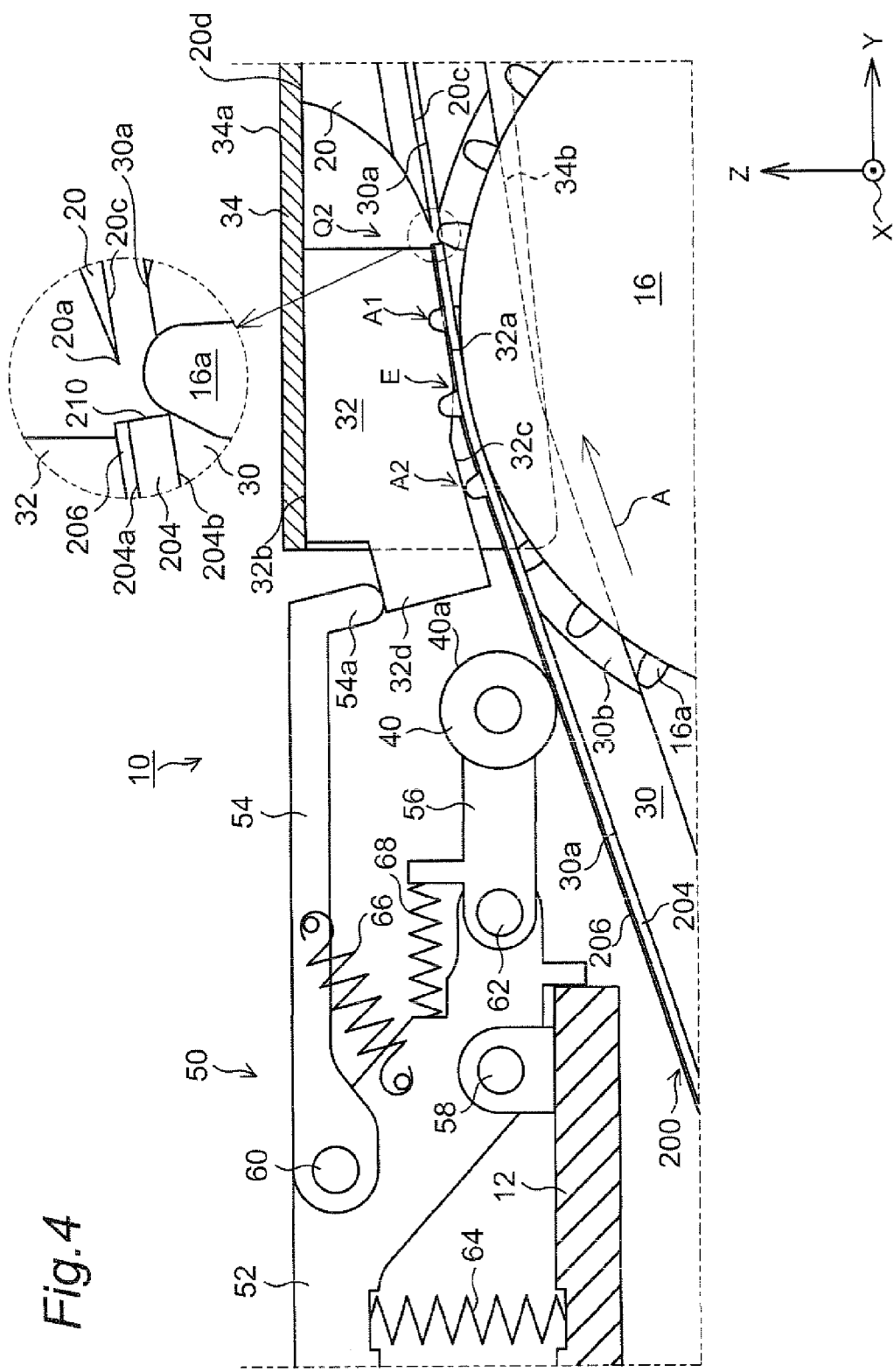
FIG. 4 is a fragmentary enlarged view of vicinity of the top tape removing position in the component supplying apparatus in a state immediately before start of removing of a top tape.
Figure 5:
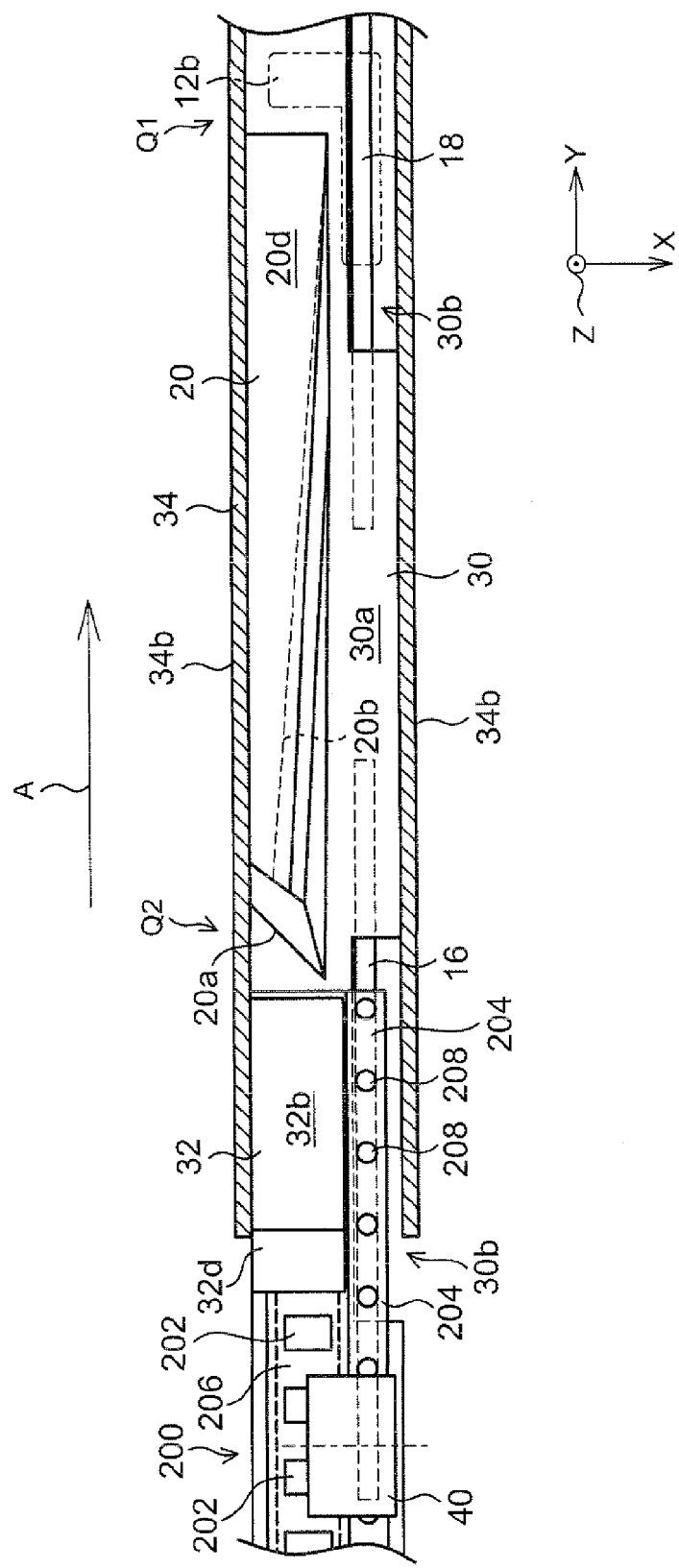
FIG. 5 shows a blade in a state immediately before the start of the removing of the top tape, as seen from a side of the top tape of the carrier tape.
Figure 6:
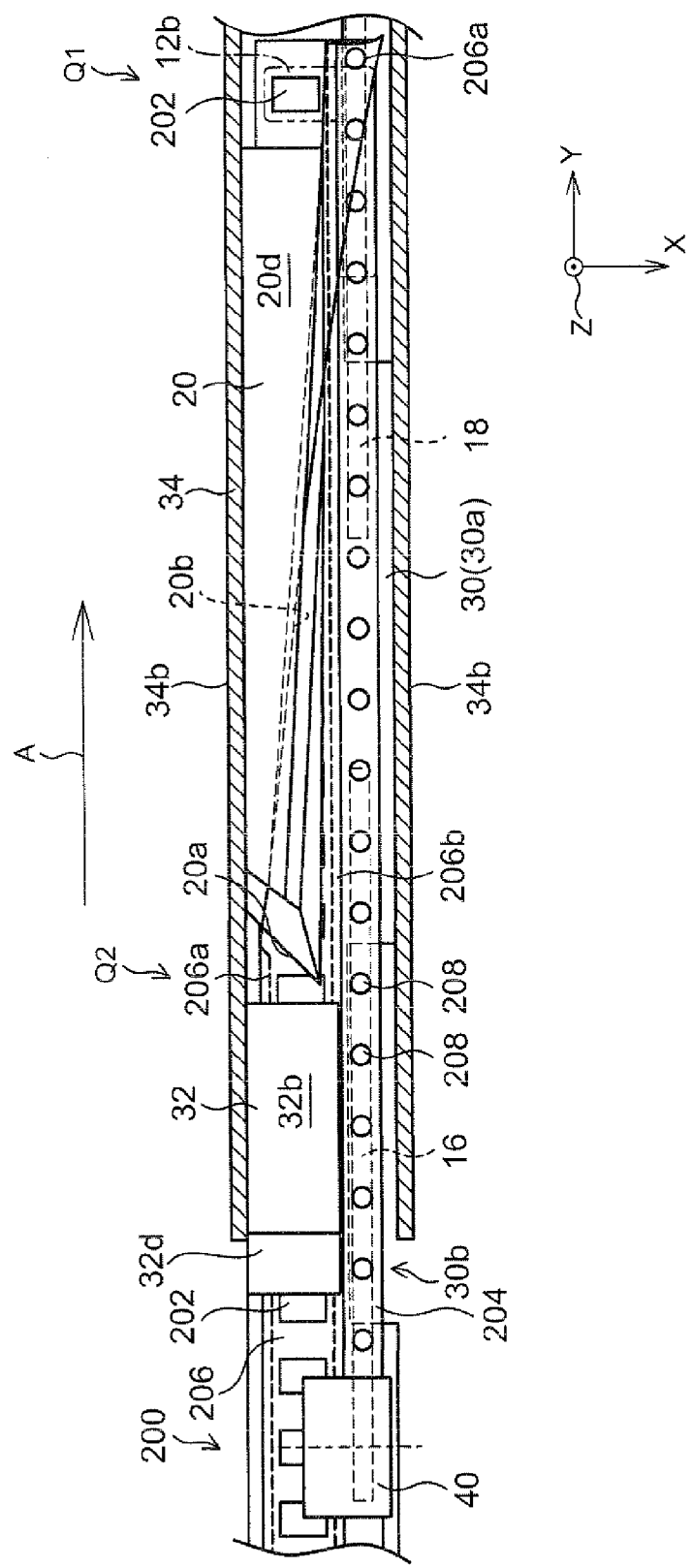
FIG. 6 shows the blade in a state during the removing of the top tape, as seen from the side of the top tape of the carrier tape.
Figure 7:
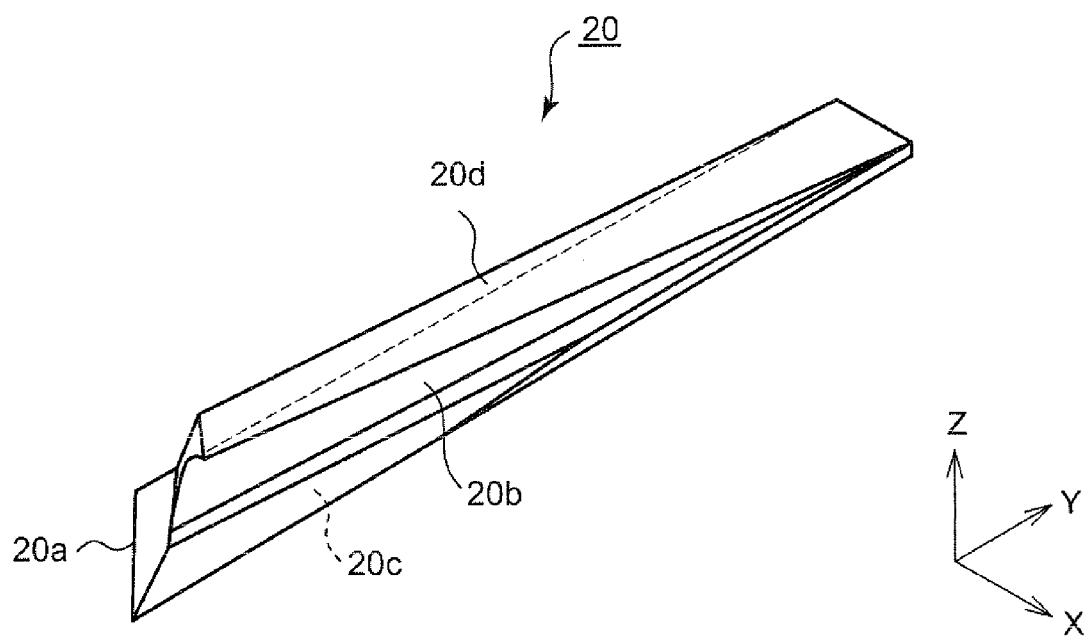
FIG. 7 is a perspective view of the blade.

FIG. 3 is a fragmentary enlarged view of the component supplying apparatus 10 including the component supply position Q1 where the components held by the carrier tape 200 are supplied onto the nozzles 102 of the transfer head 100 of the component mounting apparatus and the top tape removing position Q2 where the top tape is removed from the base tape 204 by the blade 20. FIG. 4 is a fragmentary enlarged view of vicinity of the top tape removing position Q2 in the component supplying apparatus 10 in a state immediately before start of the removing of the top tape. FIGS. 5 and 6 are fragmentary enlarged views of the vicinity of the top tape removing position Q2 in the component supplying apparatus 10, as seen from the side of the top tape 206. FIG. 5 shows a state of the blade 20 immediately before the start of the removing of the top tape 206 and FIG. 6 shows a state of the blade 20 during the removing of the top tape 206. FIG. 7 is a perspective view of the blade 20.

As shown in FIG. 3, the blade 20 is configured so as to partially remove the top tape 206 from the base tape 204 by an edge 20a at the top tape removing position Q2 positioned upstream of the component supply position Q1 in the tape feeding direction A. As shown in FIG. 4, specifically, the edge 20a is made to enter between the top tape 206 and the base tape 204 from the side of the front end 210 of the carrier tape 200 that is moving in the tape feeding direction A, and the blade 20 thereby removes the top tape 206 from the base tape 204.

As shown in FIG. 6, the blade 20 is configured so as to remove from the base tape 204 the only one end portion 206a of the top tape 206 that is an end in the tape width direction the farther from the feed holes 208, for instance. Furthermore, the blade 20 is configured so as to fold back the end portion 206a of the top tape 206 removed from the base tape 204 toward the feed holes 208.

As shown in FIG. 7, specifically, the blade 20 has a fold back part 20b for folding back the one end portion 206a (end portion that is the farther from the feed holes 208 in the tape width direction) of the top tape 206 removed from the base tape 204 by the edge 20a toward the feed holes 208. As shown in FIG. 6, the fold back part 20b guides the end portion 206a of the removed top tape 206 so that the end portion 206a of the top tape 206 removed by the edge 20a is folded back toward the feed holes 208. For this purpose, the fold back part 20b is configured by a concave and conically curved surface. By the fold back part 20b having the conically curved surface, the top tape 206 covering the recesses 202 of the base tape 204 is folded back onto the feed holes 208, so that the components in the recesses 202 are exposed to outside.

As shown in FIG. 7, the blade 20 includes a cover surface 20c for covering the recesses 202 in a portion of the main surface 204a of the base tape 204 from which the top tape 206 has partially been removed by the edge 20a. The cover surface 20c instead of the top tape 206 covers the recesses 202 of the base tape 204 in which the components are accommodated and thus the components are conveyed to the component supply position Q1 (the component supply port 12b) without escaping from the recesses 202.

Subsequently, elements of the component supplying apparatus 10 that are useful in order for the blade 20 to remove the top tape 206 from the carrier tape 200 and that are in vicinity of the blade 20 will be described.

As shown in FIGS. 3 and 4, the component supplying apparatus 10 has a tape guide part 30 for guiding the carrier tape 200 along the tape path P, and a tape press block (corresponding to "first tape press part" in the claims) 32 and a roller (corresponding to "second tape press part") 40 both of which are for pressing the carrier tape 200 against the tape guide part 30. The component supplying apparatus 10 has a cover part 34 for covering the carrier tape 200 from which the top tape 206 has been removed and supporting the blade 20 and the tape press block 32, and a lock lever part (corresponding to "first biasing part" in the claims) 50 for biasing the cover part 34 and locking the cover part 34 brought thereby into a closed state. Hereinbelow, details and roles of the tape guide part 30, the tape press block 32, the roller 40, and the lock lever part 50 will be described.

The tape guide part 30 is provided in the body part 12 of the component supplying apparatus 10, as shown in FIGS. 3 and 4, in order to feed the carrier tape 200 along the tape path P shown in FIG. 1 in the tape feeding direction A. The tape guide part 30 provided in the body part 12 may integrally be configured with the body part 12 or may be configured as a body separate from the body part 12.

Specifically, the tape guide part 30 has a tape guide surface 30a along the tape path P of the carrier tape 200. The tape guide surface 30a faces a reverse surface 204b of the base tape 200 that is opposed to the main surface 204a on which the top tape 206 is pasted. The tape guide surface 30a guides the reverse surface 204b of the base tape 204, so that the carrier tape 200 is fed by the sprocket wheels 14, 16 and 18 along the tape path P in the tape feeding direction A toward the component supply position Q1.

Formed on an end face of the tape guide part 30 in the tape width direction are recesses in which portions of the sprocket wheels 14, 16 and 18 are accommodated with the teeth 14a, 16a and 18a protruding above the tape guide surface 30a that supports the reverse surface 204b of the base tape 204 (see the recess 30b in FIGS. 4-6, for instance). Thus the teeth 14a, 16a and 18a of the sprocket wheels 14, 16 and 18 can be engaged with the feed holes 208 of the carrier tape 200 on the tape guide surface 30a.

For use of the carrier tape 200 that has embossed recesses protruding on the side of the reverse surface 204b of the base tape 204, a groove that allows passage of the embossed recesses therealong may be formed on the tape guide surface 30a of the tape guide part 30.

As shown in FIGS. 3 and 4, the tape press block 32 for pressing the carrier tape 200 against the tape guide surface 30a of the tape guide part 30 is placed so as to face the tape guide surface 30a of the tape guide part 30. As shown in FIGS. 5 and 6, the tape press block 32 does not press the main surface 204a of the base tape 204 over the entire width thereof but presses the main surface 204a of the base tape 204 while avoiding the feed holes 208, though reasons for that will be described later. For this purpose, the tape press block 32 has a tape press surface 32a that faces the main surface 204a of the base tape 204 through the top tape 206, as shown in FIG. 4.

The tape press block 32, together with the blade 20, is supported by the cover part 34 in a state in which positioning between the tape press block 32 and the blade 20 in the tape thickness direction is attained. The tape press block 32 is thereby placed upstream of the top tape removing position Q2 in the tape feeding direction A and as close as possible to the edge 20a of the blade 20.

The tape press block 32 in the state in which the positioning between the tape press block 32 and the blade 20 in the tape thickness direction is attained presses the carrier tape 200 against the tape guide part 30, and positioning of the carrier tape 200 relative to the edge 20a of the blade 20 in the tape thickness direction is thereby attained so that the carrier tape 200 is slidable (movable) in the tape feeding direction A. For this purpose, the tape press block 32 is biased toward the tape guide part 30. In the embodiment, the cover part 34 is biased toward the tape guide part 30 by the lock lever part 50, though details thereof will be described later. As a result, the tape press block 32 supported by the cover part 34, together with the blade 20 supported similarly by the cover part 34, is biased toward the tape guide part 30. That is, the lock lever part 50 functions as a biasing part for biasing the tape press block 32 in the component supplying apparatus 10. Consequently, as shown in FIG. 4, the carrier tape 200 can be held by and between the tape press surface 32a of the tape press block 32 and the tape guide surface 30a of the tape guide part 30 in the tape thickness direction.

The carrier tape 200 is held by and between the tape press surface 32a of the tape press block 32 and the tape guide surface 30a of the tape guide part 30 in the tape thickness direction, and the positioning of the carrier tape 200 in the tape thickness direction is thereby attained.

As shown in FIG. 4, specifically, contact of the top tape 206 of the carrier tape 200 with the tape press surface 32a of the tape press block 32 results in attainment of positioning in the tape thickness direction of interface between the base tape 204 and the top tape 206 relative to the edge 20a of the blade 20 that is supported together with the tape press block 32 by the cover part 34.

The component supplying apparatus 10 in accordance with the embodiment is configured so as to allow use therein of a plurality of types of the carrier tape 200, in particular, a plurality of types of the carrier tape 200 different in thickness of the base tape 204.

Accordingly, the blade 20 and the tape press block 32 that have mutual positioning attained are supported by the cover part 34 in order that the top tape 206 can be removed by the edge 20a of the blade 20 from each of the plurality of types of the carrier tape 200 different in the thickness of the base tape 204. Specifically, position of the edge 20a of the blade 20 in the tape thickness direction is determined on the basis of the tape press surface 32a of the tape press block 32 in contact with the top tape 206. This is based on a fact that the carrier tapes 200 of different types have the base tapes 204 differing in thickness within a relatively wide range of, e.g., 0.3 to 1.1 mm while having the top tapes 206 differing in thickness within a relatively narrow range of, e.g., 0.05 to 0.07 mm. Namely, this is based on the fact that the carrier tapes 200 of different types have the top tapes 206 with generally the same thicknesses.

Figure 8:
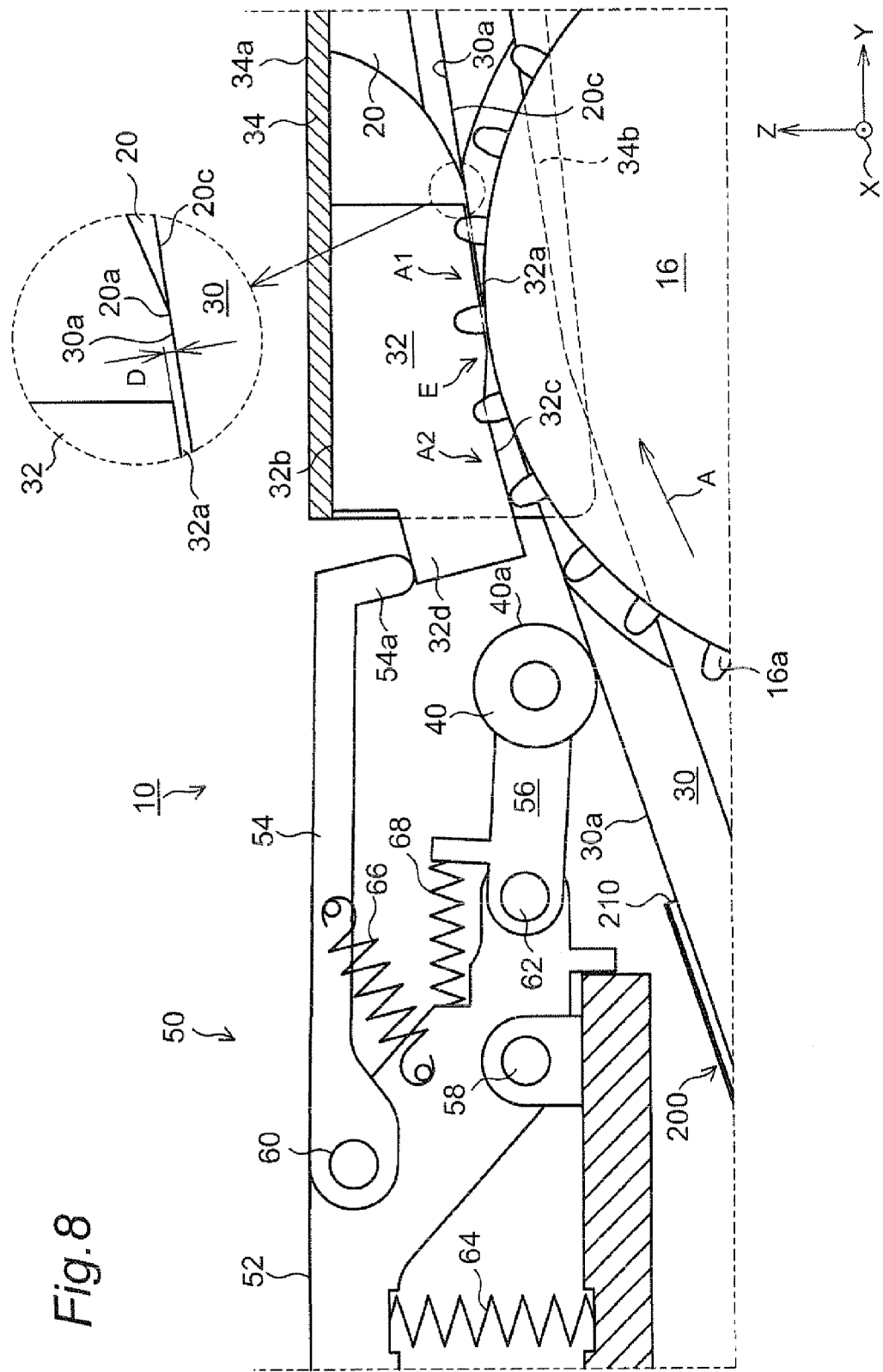
FIG. 8 is a fragmentary enlarged view of the vicinity of the top tape removing position in the component supplying apparatus in a state in which the carrier tape is absent between a tape guide part and a tape press block.

As shown in FIG. 8 representing a state of the component supplying apparatus 10 in which the carrier tape 200 is absent and is not inserted between the tape guide part 30 and the tape press block 32, accordingly, the edge 20a of the blade 20 is placed at a position at a distance D corresponding to the thickness of the top tape 206 from the tape press surface 32a of the tape press block 32 in the tape thickness direction (i.e., direction orthogonal to the tape guide surface 30a of the tape guide part 30).

Such positioning of the edge 20a of the blade 20 in the tape thickness direction on the basis of the tape press surface 32a of the tape press block 32 makes it possible for the edge 20a of the blade 20 to enter the interface between the base tape 204 and the top tape 206 even for various types of the carrier tapes 200 different in the thickness of the base tape 204, provided that the top tapes 206 thereof have generally the same thicknesses.

The positioning of the edge 20a of the blade 20 relative to the tape press surface 32a of the tape press block 32 with high accuracy may be attained by integral production of the blade 20 and the tape press block 32.

The cover part 34 is biased toward the tape guide part 30 by the lock lever part 50, as described above, and the tape press block 32 supported by the cover part 34 is thereby biased toward the tape guide part 30. When the carrier tape 200 is absent between the tape guide part 30 and the tape press block 32 as shown in FIG. 8, the tape guide surface 30a of the tape guide part 30 and the tape press surface 32a of the tape press block 32 get closer to each other.

When the cover surface 20c of the blade 20 comes close to the tape guide surface 30a of the tape guide part 30 in the embodiment, a distance between the tape guide surface 30a of the tape guide part 30 and the tape press surface 32a of the tape press block 32 becomes generally equal to thickness D of the top tape 206, for instance. Therefore, the front end 210 of the carrier tape 200 that is moving in the tape feeding direction A is required to be wedged into between the tape guide part 30 and the tape press block 32 in order to advance to the top tape removing position Q2.

A tape guide surface 32c is configured on the tape press block 32 as shown in FIG. 8 so as to make it easy for the carrier tape 200 fed by the sprocket wheel 16 to wedge itself into between the tape guide surface 30a of the tape guide part 30 and the tape press surface 32a of the tape press block 32.

As shown in FIG. 8, specifically, a facing region on the tape path P where the tape guide part 30 and the tape press block 32 face each other in the tape thickness direction includes a tape holding region A1 for holding the carrier tape 200 in the tape thickness direction and a tape introducing region A2 for introducing the carrier tape 200 into between the tape guide part 30 and the tape press block 32 in the tape holding region A1. In the tape introducing region A2, the distance between the tape guide part 30 and the tape press block 32 increases from the tape holding region A1 toward the upstream side of the tape feeding direction A.

In the tape introducing region A2, specifically, the tape guide surface 32c formed on the tape press block 32 and the tape guide surface 30a of the tape guide part 30 face each other. The tape guide surface 32c of the tape press block 32 extends from the tape press surface 32a toward the upstream side of the tape feeding direction A and gets away from the tape guide part 30 toward the upstream side of the tape feeding direction A.

The distance in the tape thickness direction between an end of the tape guide surface 32c of the tape press block 32 on the side of the entrance for the carrier tape 200 in the tape introducing region A2 as the facing region on the tape path P between the tape guide part 30 and the tape press block 32, that is, the upstream end thereof in the tape feeding direction A, and the tape guide surface 30a of the tape guide part 30 is set so as to be larger than maximum thickness of the carrier tapes 200 for use in the component supplying apparatus 10. The tape guide surface 32c of the tape press block 32 may be flat or curved and may partially include a surface parallel to the tape guide surface 30a of the tape guide part 30.

As shown in FIG. 8, the teeth 16a of the sprocket wheel 16 engage with the feed holes 208 of the carrier tape 200 in the facing region (the tape holding region A1 and the tape introducing region A2) between the tape guide part 30 and the tape press block 32 on the tape path P of the carrier tape 200.

As shown in FIGS. 5 and 6, specifically, the tape press block 32 is placed above the tape guide part 30 so as to face the top tape 206 while avoiding the feed holes 208 of the carrier tape 200 engaged with the teeth 16a of the sprocket wheel 16. That is, the tape press block 32 is configured so as to guide a portion on a side including the top tape 206 of the carrier tape 200, moving in the tape feeding direction A, along the tape guide surface 32c in the tape feeding direction A and so as to subsequently press the same by the tape press surface 32a toward the tape guide surface 30a of the tape guide part 30. The sprocket wheel 16 is placed on a side including the feed holes 208 in the tape width direction relative to the tape press block 32. As shown in FIG. 8, accordingly, the teeth 16a of the sprocket wheel 16 pass through a lateral side in the tape width direction, of the tape press surface 32a and the tape guide surface 32c of the tape press block 32.

As shown in FIG. 4, more specifically, the teeth 16a of the sprocket wheel 16 start to engage with the feed holes 208 of the carrier tape 200 in the tape introducing region A2 in the facing region between the tape guide part 30 and the tape press block 32 on the tape path P. The teeth 16a of the sprocket wheel 16 are disengaged from the feed holes 208 in the tape holding region A1 downstream of the tape introducing region A2 in the tape feeding direction A.

The portion of the carrier tape 200 on the side including the top tape 206 is guided by the tape guide surface 32c of the tape press block 32 while a portion on the side including the feed holes 208 of the carrier tape 200 guided by the tape guide surface 30a of the tape guide part 30 is held by the sprocket wheel 16. Thus the carrier tape 200 can easily be wedged into between the tape guide surface 30a of the tape guide part 30 and the tape press surface 32a of the tape press block 32.

As shown in FIGS. 3, 4 and 8, furthermore, the component supplying apparatus 10 has the roller (second tape press part) 40 as another tape press part in order to reliably wedge the carrier tape 200 into between the tape guide surface 30a of the tape guide part 30 and the tape press surface 32a of the tape press block 32 in the tape holding region A1 on the tape path P, particularly, in order to reliably wedge the carrier tape 200 that is thin or that has a tendency to curl.

As shown in FIG. 8, the roller 40 is for pressing the carrier tape 200 by an outer peripheral surface 40a thereof against the tape guide surface 30a of the tape guide part 30 so as to allow the carrier tape 200 to be moved in the tape feeding direction A and is configured so as to be freely rotatable about a rotational center line extending in the tape width direction.

The roller 40 is placed so that the outer peripheral surface 40a thereof faces the tape guide surface 30a of the tape guide part 30 on a side near to an entrance of the cover part 34 through which the carrier tape 200 moving in the tape feeding direction A enters the cover part 34. Specifically, the roller 40 is placed in a position as close as possible to the teeth 16a of the sprocket wheel 16 that engage with the feed holes 208 of the carrier tape 200 in the facing region where the tape guide part 30 and the tape press block 32 face each other and that feed the carrier tape 200 to the tape holding region A1.

In the embodiment, the roller 40 is supported by the lock lever part 50 that releasably biases the tape press block 32 together with the blade 20 toward the tape guide part 30 and is thereby biased so as to come close to the tape guide surface 30a of the tape guide part 30, though details thereof will be described later.

The roller 40 presses the carrier tape 200 against the tape guide surface 30a of the tape guide part 30 in vicinity of the upstream side of the sprocket wheel 16 in the tape feeding direction A, and thus the carrier tape 200, particularly, the carrier tape 200 that is thin (e.g., with thickness of 0.5 mm or smaller) or that has a tendency to curl can reliably be wedged into between the tape guide surface 30a of the tape guide part 30 and the tape press surface 32a of the tape press block 32. This will specifically be described below.

Figure 9:
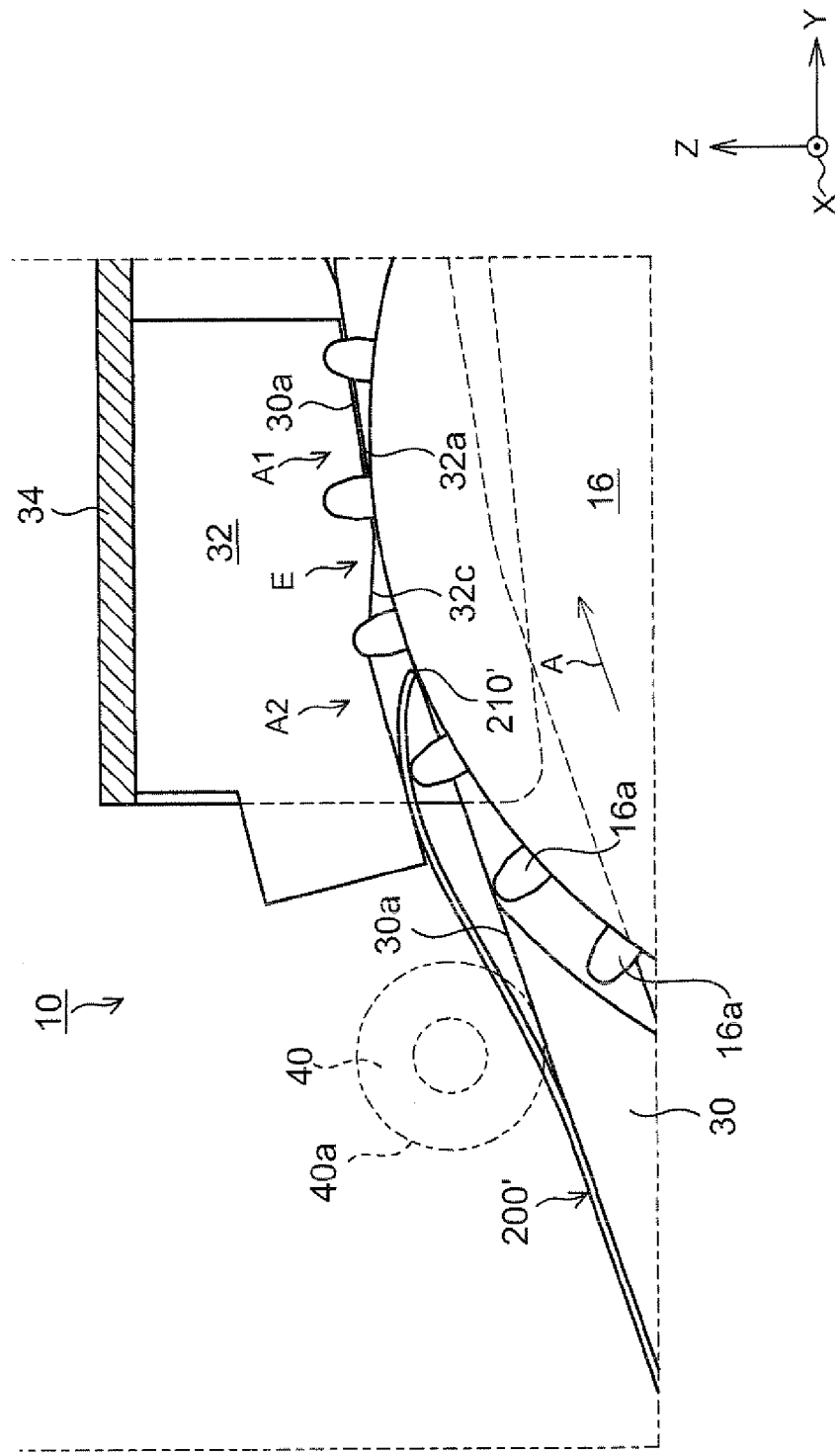
FIG. 9 is a representation for illustrating run of the carrier tape on teeth of a sprocket wheel.

On condition that the roller 40 does not exist and that a carrier tape 200' which is particularly thin or which has a tendency to curl is used, as shown in FIG. 9, there is a possibility that the carrier tape 200' may run on the teeth 16a of the sprocket wheel 16 without the feed holes thereof engaging with the teeth 16a. Herein, a phrase "tendency to curl" designates a state, in which a gentle curve of the carrier tape that is convex on the main surface side of the base tape, is kept because the carrier tape is handled in a state in which the base tape is wound on a reel.

When the carrier tape 200' having run on the teeth 16a of the sprocket wheel 16 moves in the tape feeding direction A, there is a possibility that front end 210' of the carrier tape 200' in the tape feeding direction A may fail to enter between the tape guide surface 30a of the tape guide part 30 and the tape press surface 32a of the tape press block 32. Consequently, there is a possibility that entrance (insertion) of the front end 210' of the carrier tape 200' may be hindered at an entrance E of the tape holding region A1 between the tape guide surface 30a and the tape press surface 32a and that defective feeding of the carrier tape 200' may be brought about.

In use of a thin carrier tape, such run of the carrier tape on the teeth of the sprocket wheel as may cause the defective tape feeding is caused by partial deformation of the carrier tape and breakaway of the carrier tape from the tape guide surface of the tape guide member when the front end of the carrier tape in the tape feeding direction contacts with the teeth of the sprocket wheel. In use of a carrier tape having a tendency to curl, the run on the teeth of the sprocket wheel is caused by arrival at the sprocket wheel of the carrier tape partially separated from the tape guide surface of the tape guide part and by contact of the front end of the career tape with the teeth of the sprocket wheel. That is, the run of the carrier tape on the teeth of the sprocket wheel is caused by the separation of the carrier tape from the tape guide surface of the tape guide member on the upstream side of the tape feeding direction and in vicinity of the sprocket wheel.

Figure 12:
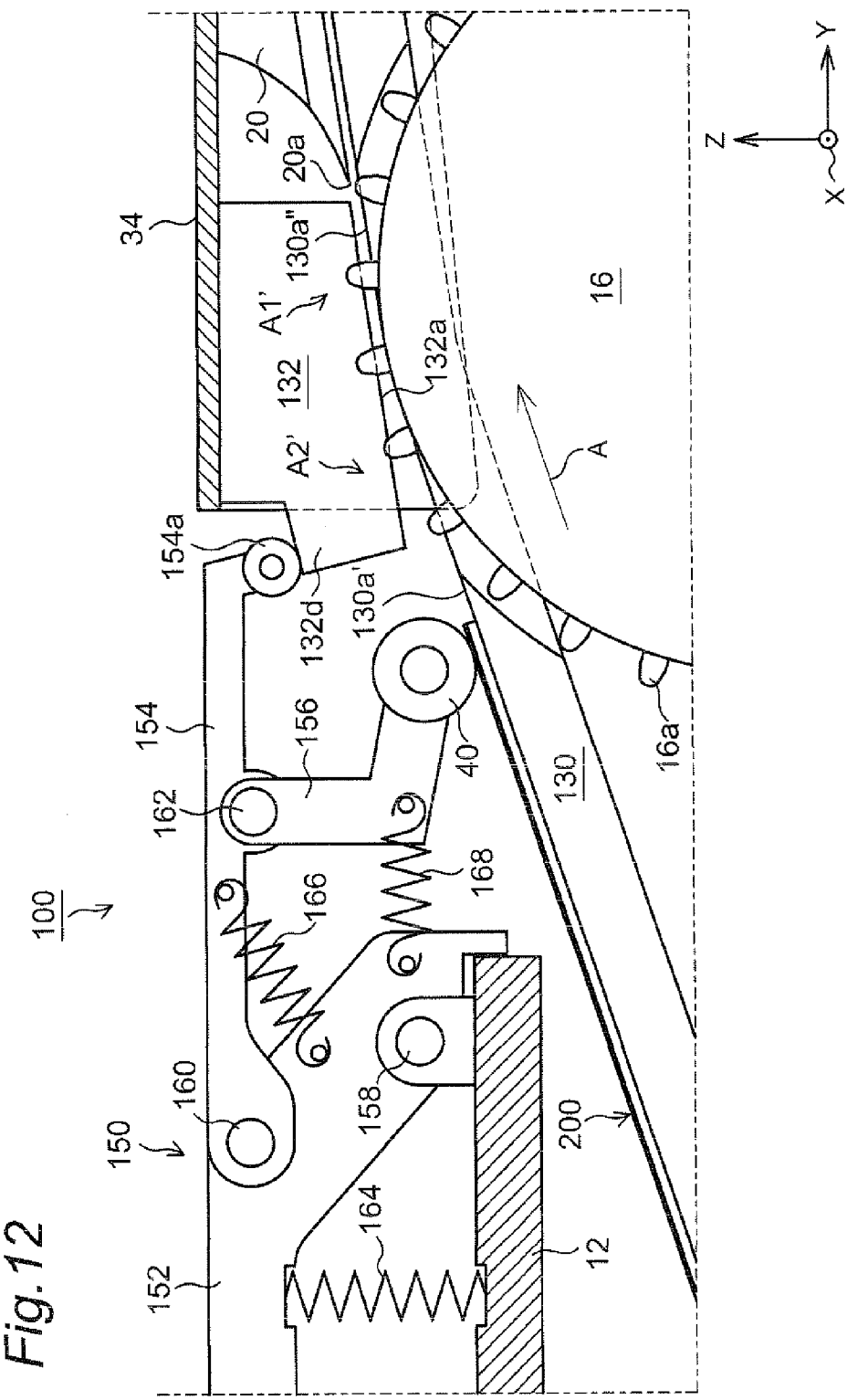
FIG. 12 is a fragmentary enlarged view of a component supplying apparatus in accordance with another embodiment.
Figure 13:
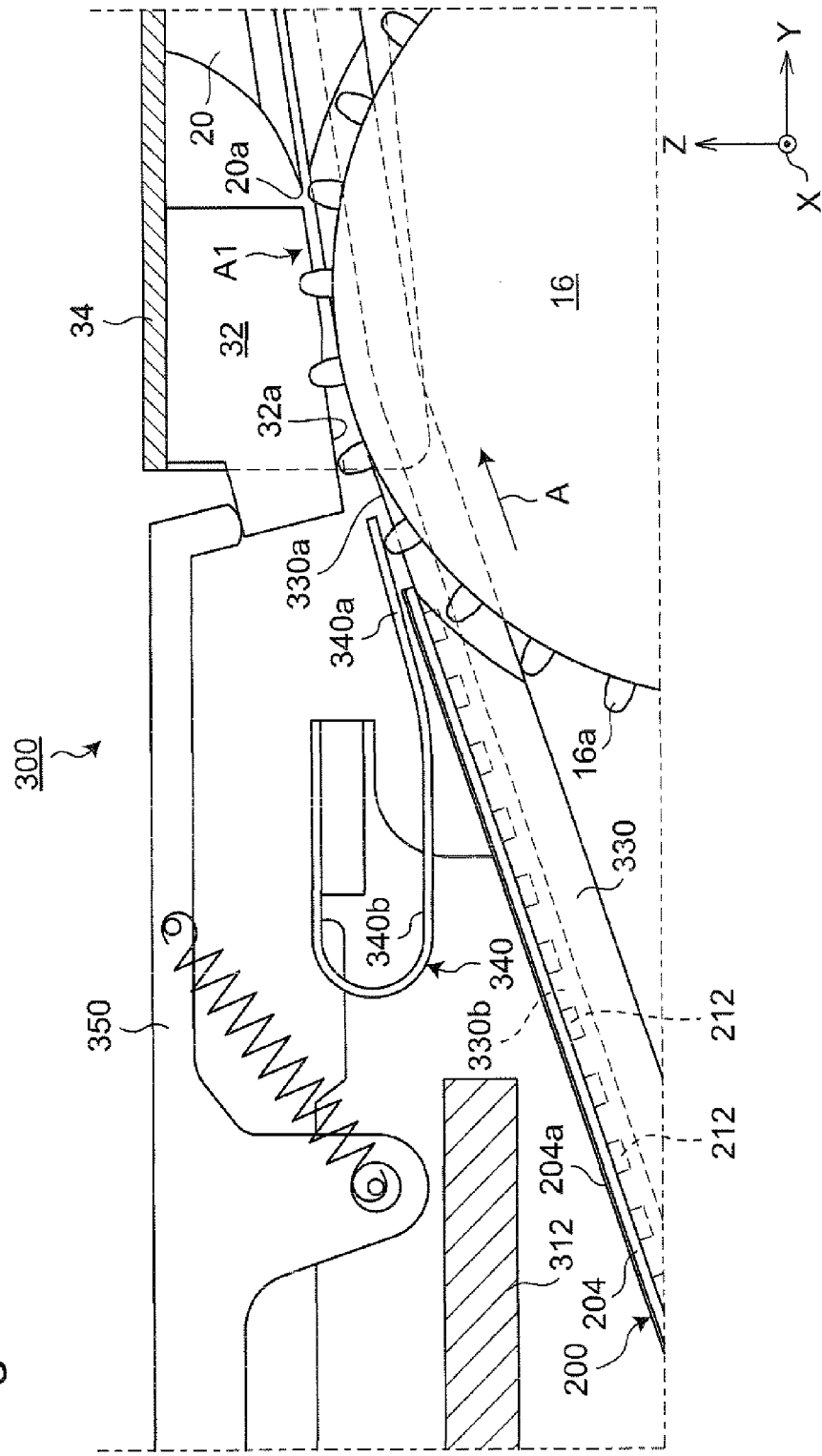
FIG. 13 is a fragmentary enlarged view of a component supplying apparatus in accordance with further another embodiment.

For measures against that, the roller 40 suppresses the run of the carrier tape 200 on the teeth 16a of the sprocket wheel 16 by pressing the carrier tape 200 against the tape guide surface 30a of the tape guide part 30 on the upstream side in the tape feeding direction A and in the vicinity of (specifically, above, as shown in FIGS. 12 and 13) the sprocket wheel 16 for engaging with the feed holes 208 of the carrier tape 200 and feeding the carrier tape 200 to the tape holding region A1 in the facing region where the tape guide part 30 and the tape press block 32 face each other, as shown in FIG. 4, for instance. This makes it possible for the carrier tape 200 to come into contact with the teeth 16a of the sprocket wheel 16 while the carrier tape 200 is in contact with the tape guide surface 30a of the tape guide part 30. In addition, the carrier tape 200 is not greatly spaced apart from the tape guide surface 30a after coming into contact with the teeth 16a. This results in smooth engagement of the feed holes 208 of the carrier tape 200 with the teeth 16a of the sprocket wheel 16.

The carrier tape 200 having the feed holes 208 engaged with the teeth 16a of the sprocket wheel 16 through agency of the roller 40 is fed in the tape feeding direction A with rotation of the sprocket wheel 16, so that the carrier tape 200 can reliably be wedged into between the tape guide surface 30a of the tape guide part 30 and the tape press surface 32a of the tape press block 32.

As shown in FIG. 5, it is preferable that the roller 40 should be smaller than tape width of the carrier tape 200 and should be placed so as to face the feed holes 208 of the carrier tape 200. Thus the portion of the carrier tape 200 on the side of the feed holes 208 can more stably be pressed against the tape guide surface 30a of the tape guide part 30 for purpose of suppressing the run of the carrier tape 200 on the teeth 16a of the sprocket wheel 16.

A twist (rolling) of the carrier tape 200 that is moving in the tape feeding direction A is suppressed because the tape press block 32 presses the portion of the carrier tape 200 on the side including the top tape 206 in the tape width direction against the tape guide surface 30a of the tape guide part 30 and because the roller 40 presses the portion of the carrier tape 200 on the side of the feed holes 208 against the tape guide surface 30a, as shown in FIG. 5.

Hereinbelow, the cover part 34 for supporting (having) the blade 20 and the tape press block 32 and the lock lever part 50 for directly or indirectly biasing and locking the cover part 34 as shown in FIG. 3 will be described.

In the embodiment, the cover part 34 supporting the blade 20 and the tape press block 32 is configured so as to cover the carrier tape 200 from which the top tape 206 is to be removed, that is, the carrier tape 200 on the top tape removing position Q2 as shown in FIG. 3. The cover part 34 is provided in the body part 12 so as to be openable upward relative to the carrier tape 200.

Specifically, the cover part 34 has a section that is generally shaped like a square bracket as seen in the length direction of the carrier tape 200 (looking in the feeding direction A) so as to cover side including the main surface 204a and both end sides in the tape width direction of the base tape 204 of the carrier tape 200 passing through the component supply position Q1 and the top tape removing position Q2.

That is, as shown in FIG. 3, the cover part 34 has a top plate part 34a extending horizontally (in Y-axis direction) above the carrier tape 200 (front end side of the tape guide part 30 in the tape feeding direction A) that passes through the component supply position Q1 and the top tape removing position Q2 in the feeding direction A and side wall parts 34b extending in a downward direction from both ends of the top plate part 34a in the tape width direction (X-axis direction). The component supply port 12b through which the components are supplied from the carrier tape 200 onto the nozzles 102 of the transfer head 100 of the component mounting apparatus is formed on the top plate part 34a of the cover part 34.

Onto reverse side of the top plate part 34a of the cover part 34 (inside of the body part 12), the blade 20 is attached through an attachment surface 20d thereof (see FIGS. 5 through 7) and the tape press block 32 is attached through an attachment surface 32b thereof (see FIGS. 4-6).

In the embodiment, as shown in FIG. 3, the cover part 34 further has a supporting point pin 36, which is extending in the tape width direction (X-axis direction) and having both ends fixed to the side wall parts 34b of the cover part 34, in a downstream part thereof in the tape feeding direction A. The supporting point pin 36 of the cover part 34 is supported by a supporting hole 12c formed on the body part 12 of the component supplying apparatus 10. The supporting hole 12c penetrates in the tape width direction (X-axis direction) and have a section shaped like an oval (long hole) elongated in Z-axis direction. The supporting point pin 36 is inserted into the supporting holes 12 so as to be rotatable and movable in the Z-axis direction.

Figure 10:
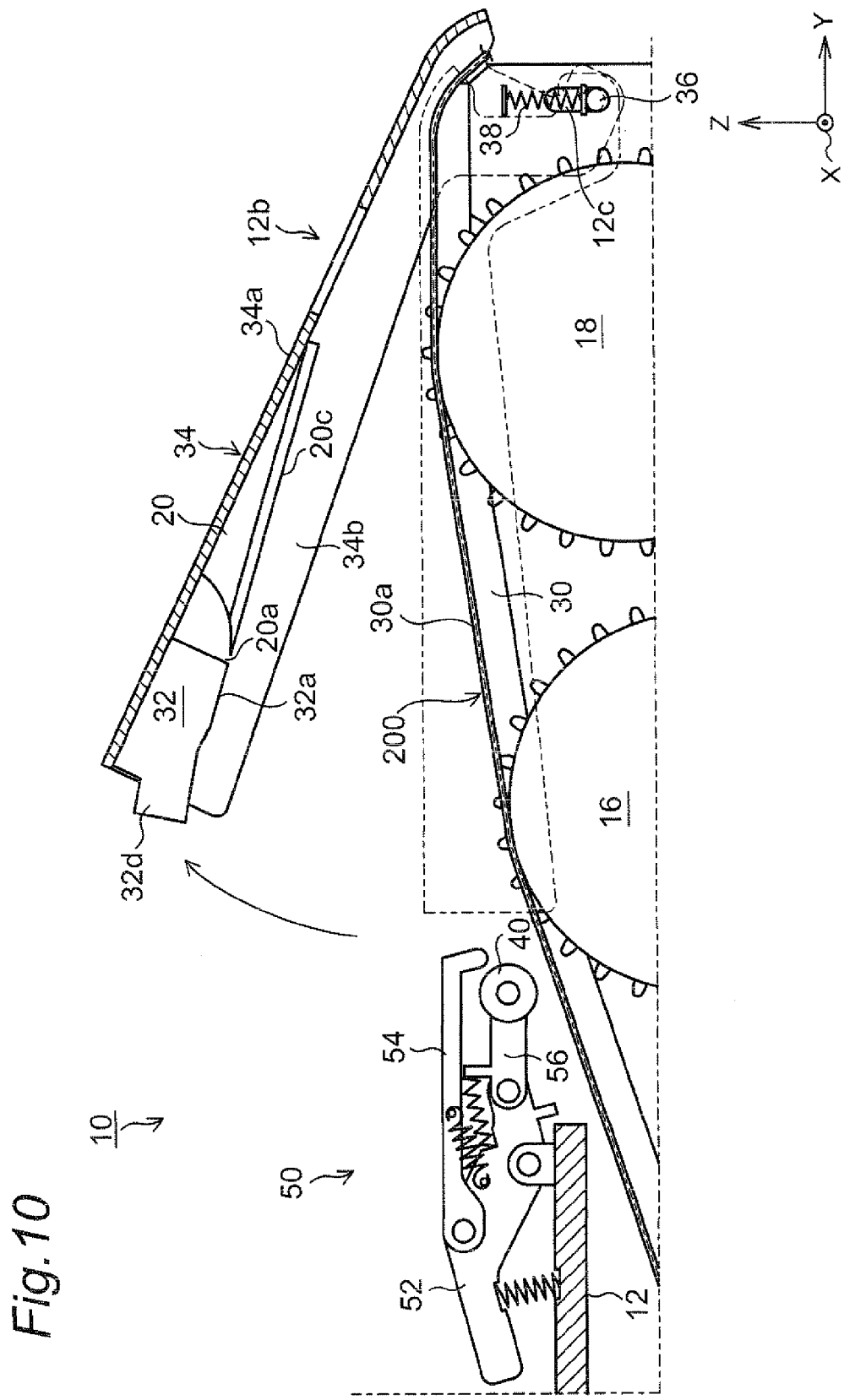
FIG. 10 is a fragmentary enlarged view of the component supplying apparatus in a state in which a cover part is opened.

As shown in FIG. 10, the cover part 34 can be opened upward relative to the carrier tape 200 on the tape guide part 30 by being made to pivot on the supporting point pin 36. The carrier tape 200 is exposed to the outside by opening of the cover part 34. Then the blade 20 and the tape press block 32 that are attached to the reverse side of the top plate part 34a of the cover part 34 are also exposed to the outside. This facilitates maintenance of the blade 20, the tape press block 32 and the like. For instance, replacement of the blade 20 is facilitated. For another instance, maintenance is facilitated such as removal of refuse of the adhesive, through which the top tape 206 is pasted on the base tape 204, has adhered onto the edge 20a, the cover surface 20c and the like of the blade 20, etc. Thus the maintenance, checks and the like are facilitated on members, such as the edge 20a of the blade 20, the tape press surface 32a of the tape press block 32, and the tape guide surface 30a of the tape guide part 30, required for supply of components with use of the carrier tape 200.

As shown in FIGS. 3 and 4, the cover part 34 is locked in the closed state by being biased downward (toward the tape guide part 30) by the lock lever part 50. Thus the carrier tape 200 can be pressed against the tape guide part 30 by the tape press block 32 supported by the cover 34.

As shown in FIG. 3, the downstream part of the cover part 34 in the tape feeding direction A may directly or indirectly be biased downward by the supporting point pin 36 of the cover part 34 biased downward by a compression spring 38. The whole cover part 34 in the tape feeding direction A is stably biased toward the tape guide part 30 by the compression spring 38 biasing the downstream part of the cover part 34 in the tape feeding direction A and by the lock lever part 50 biasing the upstream part thereof. As a result, the whole tape press surface 32a in the tape feeding direction A of the tape press block 32 supported by the cover part 34 is capable of pressing the carrier tape 200 against the tape guide surface 30a of the tape guide part 30 by more uniform forces. That is, the compression spring 38 functions as a biasing part for biasing the tape press block 32.

The lock lever part 50 for biasing and locking the cover part 34 (i.e., biasing the tape press block 32 toward the tape guide part 30) is provided in the body part 12 as shown in FIGS. 3, 4, 8 and 10. Specifically, the lock lever part 50 is supported by the body part 12 so as to be capable of oscillating about an oscillation center line (supporting point pin 58) extending in the tape width direction on the side near to the entrance of the cover part 34 through which the carrier tape 200 passes.

Figure 11:
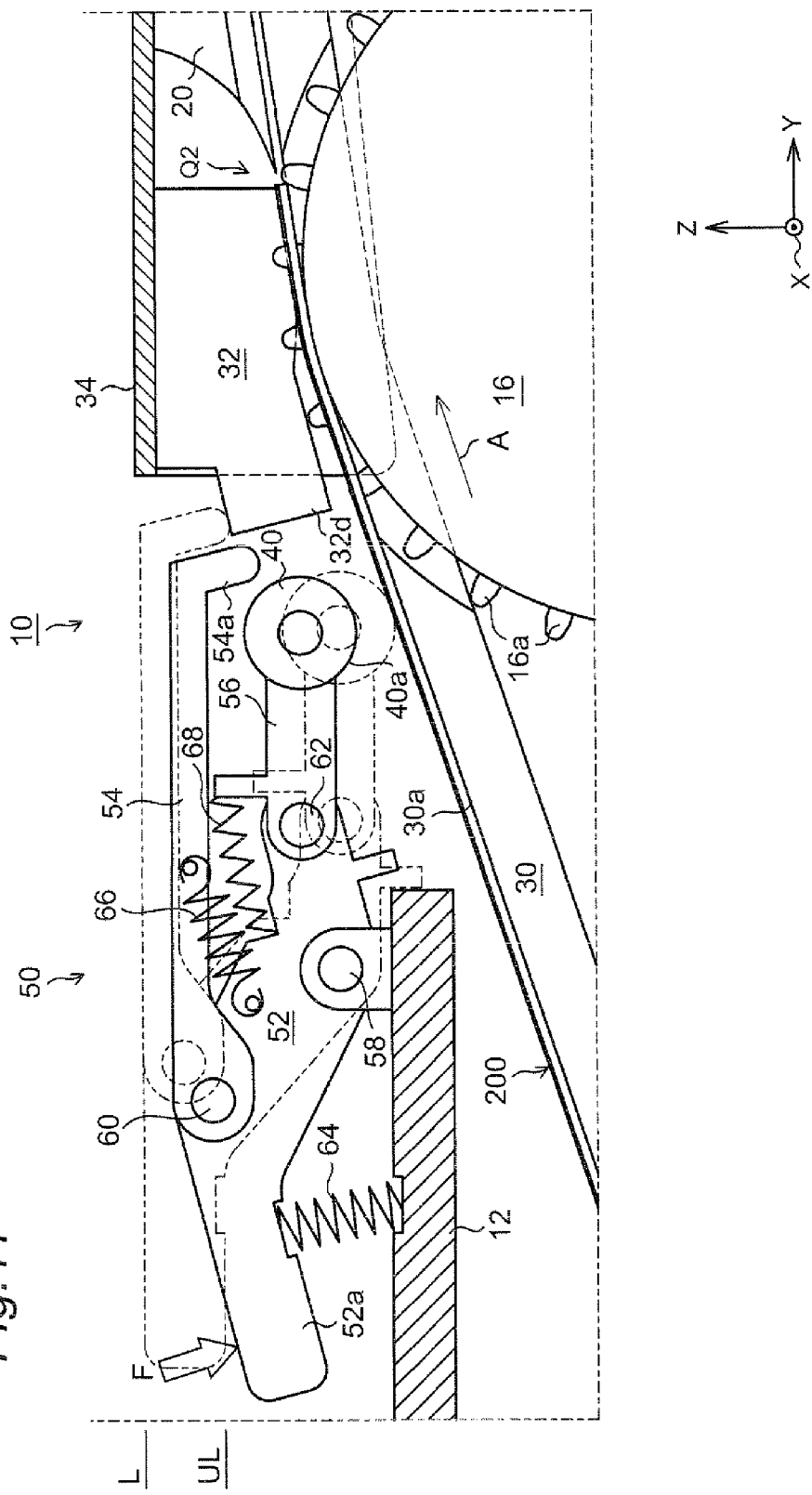
FIG. 11 is a representation showing a locked position (two-dot chain lines) of a lock lever part in which the cover part is locked and an unlocked position (solid lines) of the lock lever part in which the cover part has been unlocked.

The lock lever part 50 oscillates between a locked position where the cover part 34 is locked in the closed state as shown by two-dot chain lines in FIG. 11 and shown in FIG. 3 and an unlocked position where the cover part 34 is unlocked as shown by solid lines in FIG. 11 and shown in FIG. 10.

In the embodiment, the lock lever part 50 has a lever body part 52 that is operated by a user, a first arm part 54 that is supported by the lever body part 52 so as to be capable of oscillating and that comes into contact with the cover part 34 to bias the same, and a second arm part 56 that is supported by the lever body part 52 so as to be capable of oscillating.

The lever body part 52 of the lock lever part 50 is supported by the supporting point pin 58 that is provided on the body part 12 of the component supplying apparatus 10 and that extends in the tape width direction (X-axis direction) and is configured so as to be capable of oscillating about the supporting point pin 58. The lever body part 52 has an operation part 52a for operation by a user on a free end side thereof that is the farther from the cover part 34 with respect to the supporting point pin 58.

The first arm part 54 is supported by a supporting point pin 60 that is provided on the lever body part 52 and that extends in the tape width direction (X-axis direction) and is configured so as to be capable of oscillating about the supporting point pin 60. The supporting point pin 60 is provided on a portion of the lever body part 52 that is on the farther side from the cover part 34 with respect to the supporting point pin 58 connecting the lock lever part 50 to the body part 12 so as to allow oscillation of the lock lever part 50 and that is between the operation part 52a and the supporting point pin 58.

The first arm part 54 extends from the supporting point pin 60 that supports the first arm part 54 so as to allow oscillation thereof toward the cover part 34. The first arm part 54 has a cover contact part 54a that comes into contact with the cover part 34 in order to lock the cover part 34 in the closed state, on free end side thereof. In the embodiment, the cover contact part 54a of the first arm part 54 comes into contact with the tape press block 32 that is provided so as to be supported by the cover part 34. As shown in FIG. 4, specifically, the tape press block 32 includes a protruding part 32d protruding toward outside of the cover part 34 for the contact with the cover contact part 54a of the first arm part 54. That is, the cover part 34 is in indirect contact with the lock lever part 50 through the tape press block 32.

The second arm part 56 is supported by a supporting point pin 62 that is provided on the lever body part 52 and that extends in the tape width direction (X-axis direction) and is configured so as to be capable of oscillating about the supporting point pin 62. The supporting point pin 62 is provided on a free end side of the lever body part 52 that is on the nearer side to the cover part 34 with respect to the supporting point pin 58 connecting the lock lever part 50 to the body part 12 so as to allow the oscillation of the lock lever part 50.

The second arm part 56 extends toward the cover part 34 from the supporting point pin 60 that supports the second arm part 56 so as to allow oscillation thereof. The second arm part 56 supports on free end side thereof the roller 40 for biasing the portion of the carrier tape 200 on the side of the feed holes 208 toward the tape guide part 30 at the upstream side of the top tape removing position Q2 in the tape feeding direction A and on the side of the entrance of the facing region where the tape press block 32 of the cover part 34 and the tape guide part 30 face each other.

The lock lever part 50 has springs 64-68 as biasing parts for biasing the lever body part 52, the first arm part 54, and the second arm part 56.

As shown in FIG. 3, the spring 64 biases the lever body part 52 toward the position (locked position L) of the lever body part 52 on occasion when the lock lever part 50 locks the cover part 34 in the closed state against the tape guide part 30 of the body part 12. In the embodiment, the spring 64 is a compression spring. One end of the compression spring 64 is connected to the portion of the lever body part 52 that is on the farther side from the cover part 34 with respect to the supporting point pin 58 connecting the lock lever part 50 to the body part 12 so as to allow the oscillation of the lock lever part 50. The other end of the compression spring 64 is connected to the body part 12 of the component supplying apparatus 10.

The spring 66 biases the first arm part 54 so that the cover contact part 54a of the first arm part 54 comes into contact with the cover part 34 (the protruding part 32d of the tape press block 32) when the lever body part 52 is in the locked position L in which the lock lever part 50 locks the cover part 34 in the closed state as shown in FIG. 3. In the embodiment, the spring 66 is a tension spring having one end thereof connected to the first arm part 54 and the other end connected to the lever body part 52.

The spring (corresponding to "second biasing part" in the claims) 68 biases the second arm part 56 so that the outer peripheral surface 40a of the roller 40 supported on the free end side thereof comes into contact with (biases) the tape guide surface 30a of the tape guide part 30 at the upstream side in the tape feeding direction A of the sprocket wheel 16 for edging the carrier tape 200 in the tape feeding direction A into between the tape guide part 30 and the tape press block 32 by rotating while engaging with the feed holes 208 of the carrier tape 200 and at the entrance side of the facing region where the tape guide part 30 and the tape press block 32 face each other on the upstream side in the tape feeding direction A of the tape removing position Q2 as shown in FIGS. 4 and 8, when the lever body part 52 is in the locked position L in which the lock lever part 50 locks the cover part 34 in the closed state as shown in FIG. 3. In the embodiment, the spring 68 is a tension spring having one end thereof connected to the second arm part 56 and the other end connected to the lever body part 52.

When a user presses down the operation part 52a of the lever body part 52 of the lock lever part 50 from the locked position L with given force F as shown in FIG. 11, the lever body part 52 oscillates about the supporting point pin 58. With the oscillation of the lever body part 52, the first arm part 54 oscillates about the supporting point pin 60 and the second arm part 56 oscillates about the supporting point pin 62. When the lock lever part 50 oscillates to be in the unlocked position UL as shown by the solid lines in FIG. 11, the cover contact part 54a of the first arm part 54 is spaced apart from the cover part 34 (the protruding part 32d of the tape press block 32 attached to the cover part 34) and is located in a position that does not interfere with the cover part 34 opened or closed. On the other hand, the roller 40 moves in a direction in which the roller 40 is spaced apart from the tape guide surface 30a of the tape guide part 30 (or the carrier tape 200 on the tape guide surface 30a).

When the user takes his/her hand off the operation part 52a of the lever body part 52 of the lock lever part 50 in the unlocked position UL, the lever body part 52 oscillates about the supporting point pin 58 by action of the spring 64 and returns from the unlocked position UL to the locked position L. This makes the first arm part 54 oscillate about the supporting point pin 60, brings the cover contact part 54a into contact with the cover part 34 (the protruding part 32d of the tape press block 32 attached to the cover part 34), and locks the cover part 34 in the closed state. Then the second arm part 56 oscillates about the supporting point pin 62, and the outer peripheral surface 40a of the roller 40 comes into contact with the tape guide surface 30a of the tape guide part 30. On condition that the carrier tape 200 resides on the tape guide surface 30a, the roller 40 comes into contact with the carrier tape 200 and presses the carrier tape 200 against the tape guide surface 30a.

Such lock lever part 50 facilitates maintenance of the component supplying apparatus 10. That is, the operation of the lock lever part 50 by the user makes it possible to open and close the cover part 34 relative to the tape guide part 30 of the body part 12 and spaces the roller 40 apart from the carrier tape 200 on the tape guide surface 30a of the tape guide part 30 so that the carrier tape 200 can be taken out. For instance, the user operates the lock lever part 50 by one hand and opens the cover part 34 having the tape press block 32 and the blade 20 by the other hand. After opening the cover 34, the user takes out the carrier tape 200 from on the tape guide surface 30a of the tape guide part 30 by the other hand. This facilitates the maintenance of the blade 20 attached to the reverse side of the cover part 34, the tape guide surface 30a of the tape guide part 30, the tape press surface 32a of the tape press block 32, and the like.

For supplement on the lock lever part 50, as shown in FIG. 11, the second arm part 56 supporting the roller 40 on the free end side thereof extends toward the cover part 34 from the supporting point pin 62 that supports the second arm part 56 so as to allow the oscillation thereof, that is, generally extends in the tape feeding direction A. This makes the carrier tape 200 more prone to wedge itself into between the outer peripheral surface 40a of the roller 40 and the tape guide surface 30a of the tape guide part 30 that are in contact with each other, in comparison with configurations having the second arm part 56 extending in other directions. That is, the roller 40 is made prone to move in the direction in which the roller 40 is spaced apart from the tape guide part 30 when the carrier tape 200 is wedged into between the outer peripheral surface 40a of the roller 40 and the tape guide surface 30a of the tape guide part 30 that are in contact with each other.

According to a configuration of the lock lever part 50 shown in FIG. 11, force with which the first arm part 54 biases the cover part 34 having the tape press block 32 and the blade 20 (i.e., force with which the tape press block 32 presses the carrier tape 200 toward the tape guide member 30) and force with which the second arm part 56 biases the roller 40 (i.e., force with which the roller 40 presses the carrier tape 200 against the tape guide member 30) can independently be adjusted by adjustment in elastic forces of the springs 66 and 68, respectively.

In use of the carrier tape 200 having a strong tendency to curl, for instance, the spring 68 as the biasing part, which biases the roller 40 in order to press the carrier tape 200 against the tape guide part 30 by the roller 40 at the side of the entrance of the facing region between the tape press block 32 of the cover part 34 and the tape guide part 30, has biasing force (elastic force) capable of countering the tendency to curl. This makes it possible to increase the force with which the roller 40 presses the carrier tape 200 against the tape guide surface 30a of the tape guide part 30 and makes it possible for the feed holes 208 of the carrier tape 200 to reach the sprocket wheel 16 while being in contact with the tape guide surface 30a. As a result, occurrence of the defective tape feeding can reliably be suppressed that may be caused by run of the carrier tape 200 having a strong tendency to curl on the teeth 16a of the sprocket wheel 16, or the like.

In use of the carrier tape 200 that is thin, for instance, too strong biasing force of the spring 68 may make it impossible for the carrier tape 200 to pass through between the outer peripheral surface 40a of the roller 40 and the tape guide surface 30a of the tape guide part 30 in the tape feeding direction A and may cause jamming of the carrier tape 200 therebetween that may result in the defective tape feeding. In this case, a spring having biasing force (elastic force) that allows the thin carrier tape 200 to smoothly pass through between the outer peripheral surface 40a of the roller 40 and the tape guide surface 30a of the tape guide part 30 without causing the defective tape feeding is used as the spring 68 for biasing the roller 40.

Thus the force with which the roller 40 presses the carrier tape 200 against the tape guide surface 30a can be changed according to types of the carrier tape 200 handled by the component supplying apparatus 10, independently of the biasing force for the tape press block 32 for relatively pressing the carrier tape 200 against the tape guide surface 30a of the tape guide part 30 (i.e., elastic force of the spring 66 as the biasing part with which the first arm part 54 of the lock lever part 50 biases the tape press block 32 of the cover part 34) in order to attain the positioning of the carrier tape 200 relative to the edge 20a of the blade 20 in the tape thickness direction. This makes it possible for the component supplying apparatus 10 to normally feed various types of the carrier tapes 200 different in the tape thickness (such as carrier tapes made of paper material and embossed tapes made of plastic material).

According to the embodiment, as described above, the feed holes 208 of the plurality of types of the carrier tapes 200, in particular, the feed holes 208 of the carrier tape 200 that is thin or that has a tendency to curl can stably be engaged with the teeth 16a of the sprocket wheel 16 and the occurrence of the defective feeding of the carrier tapes 200 can be suppressed.

Though the invention has been described with reference to the above embodiment, the invention is not limited to the embodiment.

In the above embodiment, for instance, the facing region on the tape path in which the tape guide part 30 and the tape press block 32 face each other as shown in FIG. 8, for instance, includes the tape holding region A1 in which the carrier tape 200 is held between the tape guide surface 30a of the tape guide part 30 and the tape press surface 32a of the tape press block 32 and the tape introducing region A2 through which the carrier tape 200 is introduced into between the tape guide surface 30a and the tape press surface 32a. In the tape introducing region A2, the tape press block 32 has the tape guide surface 32c that is increasingly distant from the tape guide surface 30a of the tape guide part 30 toward the upstream side of the tape feeding direction A from the tape press surface 32a. When the carrier tape 200 follows the tape guide surface 30a of the tape guide part 30 by being biased by the roller 40 toward the tape guide part 30 and is fed toward the tape holding region A1 with the feed holes 208 of the carrier tape 200 engaged with the teeth 16a of the sprocket wheel 16, the tape guide surface 32c of the tape press block 32 in the tape introducing region A2 makes it possible to easily wedge the carrier tape 200 into between the tape guide surface 30a of the tape guide part 30 and the tape press surface 32a of the tape press block 32 in the tape holding region A1.

As shown in FIG. 12 representing a fragmentary enlarged view of a component supplying apparatus 100 in accordance with another embodiment, alternatively, tape holding regions A1' and A2' can be formed of a tape guide part 130 having continuing tape guide surfaces 130a' and 130a" with different inclination angles relative to horizontal direction.

In the component supplying apparatus 100 in accordance with another embodiment, as shown in FIG. 12, a tape press block 132 has a plain surface 132a facing a surface of the carrier tape 200 on the tape guide part 130. For the positioning of the carrier tape 200 relative to the edge 20a of the blade 20 in the tape thickness direction, the carrier tape 200 is held in the tape thickness direction between a downstream portion of the plain surface 132a of the tape press block 132 in the tape thickness direction A and the tape guide surface 130a" of the tape guide part 130 that is parallel to the plain surface 132a.

The tape guide surface 130a' of the tape guide part 130 extends so as to be increasingly distant from the plain surface 132a of the tape press block 132 toward the downstream side of the tape feeding direction A. The tape guide surface 130a' makes it possible to easily wedge the carrier tape 200 into between the tape guide surface 130a" of the tape guide part 130 and the downstream portion of the plain surface 132a of the tape press block 132 in the tape feeding direction A.

In the embodiment described above, as shown in FIG. 3, the tape press block 32 presses the carrier tape 200 against the tape guide surface 30a of the tape guide part 30 for attaining the positioning of the carrier tape 200 relative to the edge 20a of the blade 20 in the tape thickness direction. The tape press block 32 is provided so as to be supported together with the blade 20 by the cover part 34 and is biased by the lock lever part 50 through the cover part 34. Alternatively, the tape press block 32 may directly be biased by a biasing member such as spring. In a broad sense, the tape press block 32 has only to be capable of pressing the carrier tape 200 against the tape guide member 30 by being biased together with the blade 20 toward the tape guide member 30 in the state in which the positioning of the tape press block 32 relative to the blade 20 is attained.

In the embodiment described above, as shown in FIG. 4, the roller 40, which presses the carrier tape 200 against the tape guide surface 30a of the tape guide part 30 at the side of the entrance of the facing region between the tape press block 32 of the cover part 34 and the tape guide part 30, is supported by the lock lever part 50 for locking the cover part 34. Alternatively, the roller 40 may be provided on the cover part 34 or the body part 12 to press the carrier tape 200 against the tape guide part 30.

In the embodiment described above, as shown in FIG. 8, the roller 40 is the tape press part for pressing the carrier tape 200 against the tape guide surface 30a of the tape guide part 30 in order to suppress the run of the carrier tape 200 on the teeth 16a of the sprocket wheel 16 for feeding the carrier tape 200 to the tape holding region A1 in the facing region between the tape press block 32 of the cover part 34 and the tape guide part 30. The tape press part, however, is not limited thereto. The carrier tape 200 can be pressed against the tape guide part by a tape facing part 340a of a plate-like biasing part 340 (e.g., plate spring), for instance, in place of the roller 40.

FIG. 13 is a fragmentary enlarged view of a component supplying apparatus 300 in accordance with further another embodiment. As shown in FIG. 13, the component supplying apparatus 300 has the plate-like biasing part 340 as the tape press part for suppressing the run of the carrier tape 200 on the teeth 16a of the sprocket wheel 16 for feeding the carrier tape 200 to the tape holding region A1 in a facing region between the tape press block 32 of the cover part 34 and a tape guide part 330.

The plate-like biasing part 340 is produced by bending work on a strip-like thin metal plate having flexibility, for instance. The plate-like biasing part 340 has the plate-like tape facing part 340a (corresponding to "second tape press part" in the claims) that functions as the tape press part facing the main surface 204a of the base tape 204 in the carrier tape 200 on a tape guide surface 330a of the tape guide part 330 and a base part 340b (corresponding to "second biasing part" in the claims) that functions as a biasing part for biasing the tape facing part 340a as the tape press part toward the tape guide part 330.

The tape facing part 340a of the plate-like biasing part 340 is placed above the tape guide part 330 and is fixed through the base part 340b to a body part 312 of the component supplying apparatus 300.

The tape facing part 340a of the plate-like biasing part 340 is in shape of a displaceable cantilever having one end supported by the base part 340b and extends from the base part 340b toward the downstream side of the tape feeding direction A. The tape facing part 340a extends at a slant above the tape guide part 330 so that distance between the tape facing part 340a and the tape guide part 330 is smaller in the downstream side than in the upstream side of the tape feeding direction A.

When the carrier tape 200 is absent between the tape facing part 340a of the plate-like biasing part 340 and the tape guide part 330, the tape facing part 340a is not in contact with and is apart from the tape guide part 330. The smallest distance between the tape facing part 340a and the tape guide part 330 is set smaller than the thickness of the carrier tape 200 that passes through therebetween so that the tape facing part 340a of the plate-like biasing part 340 can press the carrier tape 200 against the tape guide part 330. On condition that the thickness of the carrier tape 200 is in a range from 0.25 to 0.6 mm, for instance, the smallest distance between the tape facing part 340a and the tape guide part 330 is set in a range from 0.15 to 0.5 mm, for instance.

In a configuration in which there is no contact between the tape facing part 340a of the plate-like biasing part 340 and the tape guide part 330 and in which the distance between the tape facing part 340a and the tape guide part 330 is gradually decreased toward the downstream side from the upstream side of the tape feeding direction A, the carrier tape 200 can more smoothly be passed through between the tape facing part 340a of the plate-like biasing part 340 and the tape guide part 330 (in comparison with configurations having the tape facing part 340a and the tape guide part 330 in contact with each other). With use of the plate-like biasing part 340, the carrier tape 200 that has a tendency to curve on front end side thereof in the tape feeding direction A and that tends to float up from the tape guide surface 330a of the tape guide part 330 can stably be fed toward the sprocket wheel 16 while being in contact with the tape guide surface 330a of the tape guide part 330 without gaps.

The tape facing part 340a of the plate-like biasing part 340 extends to vicinity of an entrance of the facing region between the tape press block 32 and the tape guide part 330.

Specifically, the tape facing part 340a of the plate-like biasing part 340 comes into contact with the carrier tape 200 so as to cover the feed holes 208 in which the teeth 16a of the sprocket wheel 16 do not exist or the feed holes 208 in which the teeth 16a of the sprocket wheel 16 having entered therein are not beyond the main surface 204a of the base tape 204, and presses the carrier tape 200 against the tape guide part 330.

The plate-like biasing part 340 suppresses the run of the carrier tape 200 onto the teeth 16a of the sprocket wheel 16. In comparison with the roller 40 of the component supplying apparatus 10 in accordance with the embodiment described above, the tape facing part 340a of the plate-like biasing part 340 is simpler in configuration and is capable of pressing the carrier tape 200 against the tape guide part 330 while being closer to the sprocket wheel 16.

Though the plate-like biasing part 340 is mounted on the body part 312 of the component supplying apparatus 300 as shown in FIG. 13, there is no limitation to that. As is the case with the roller 40 of the component supplying apparatus 10 in accordance with the embodiment described above, the plate-like biasing part 340 may be mounted on a lock lever part 350 for locking the cover part 34 in the closed state.

A portion of the tape facing part 340a of the plate-like biasing part 340 may face, in the tape thickness direction, a portion of the carrier tape 200 (the main surface 204a of the base tape 204) on at least one side in the tape width direction of the feed holes 208 in which the teeth 16a of the sprocket wheel 16 have entered at least partially.

Figure 14:
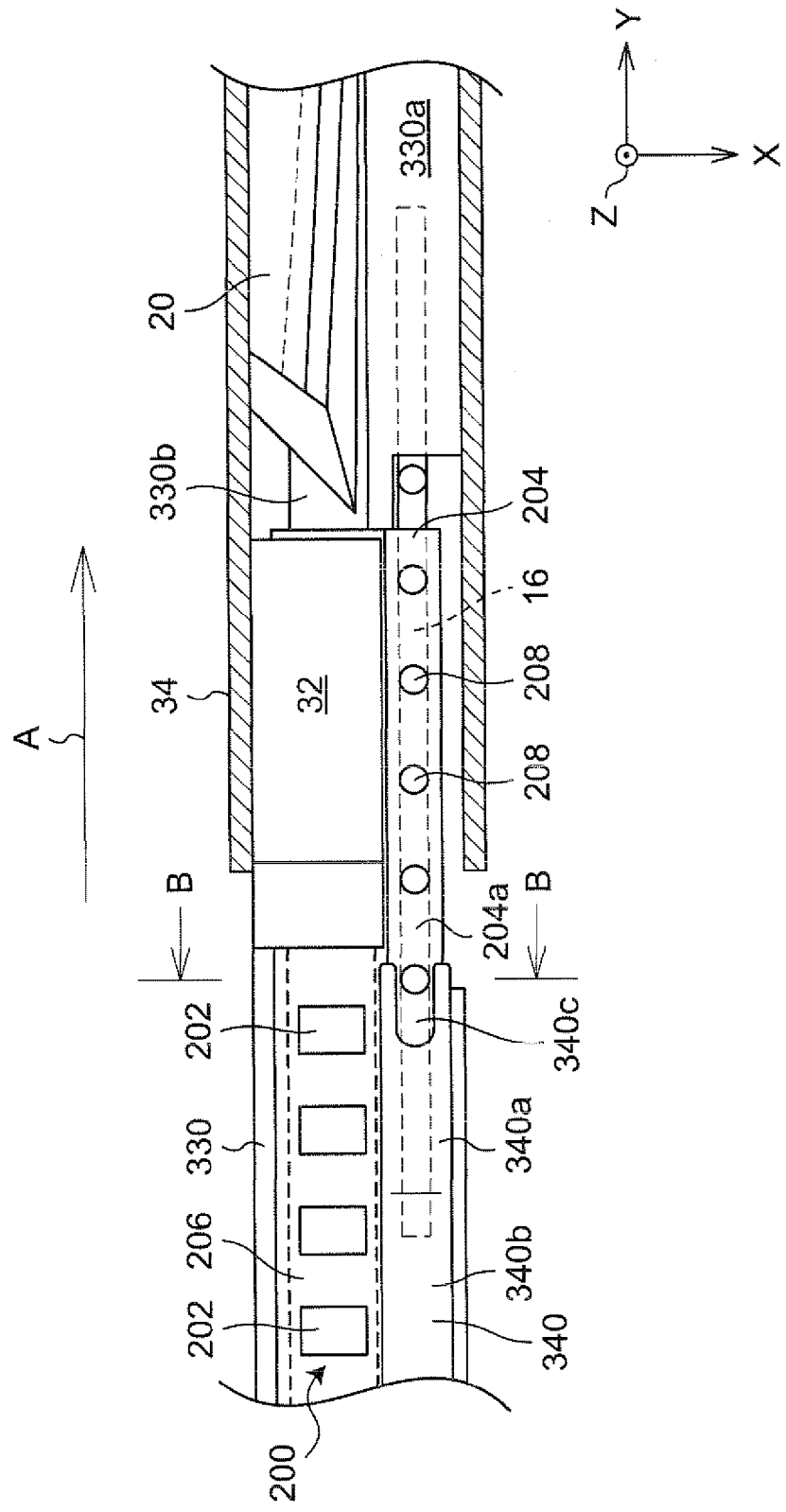
FIG. 14 is a fragmentary enlarged view of a component supplying apparatus in accordance with further another embodiment, as seen from the side of the top tape of the carrier tape.
Figure 15:
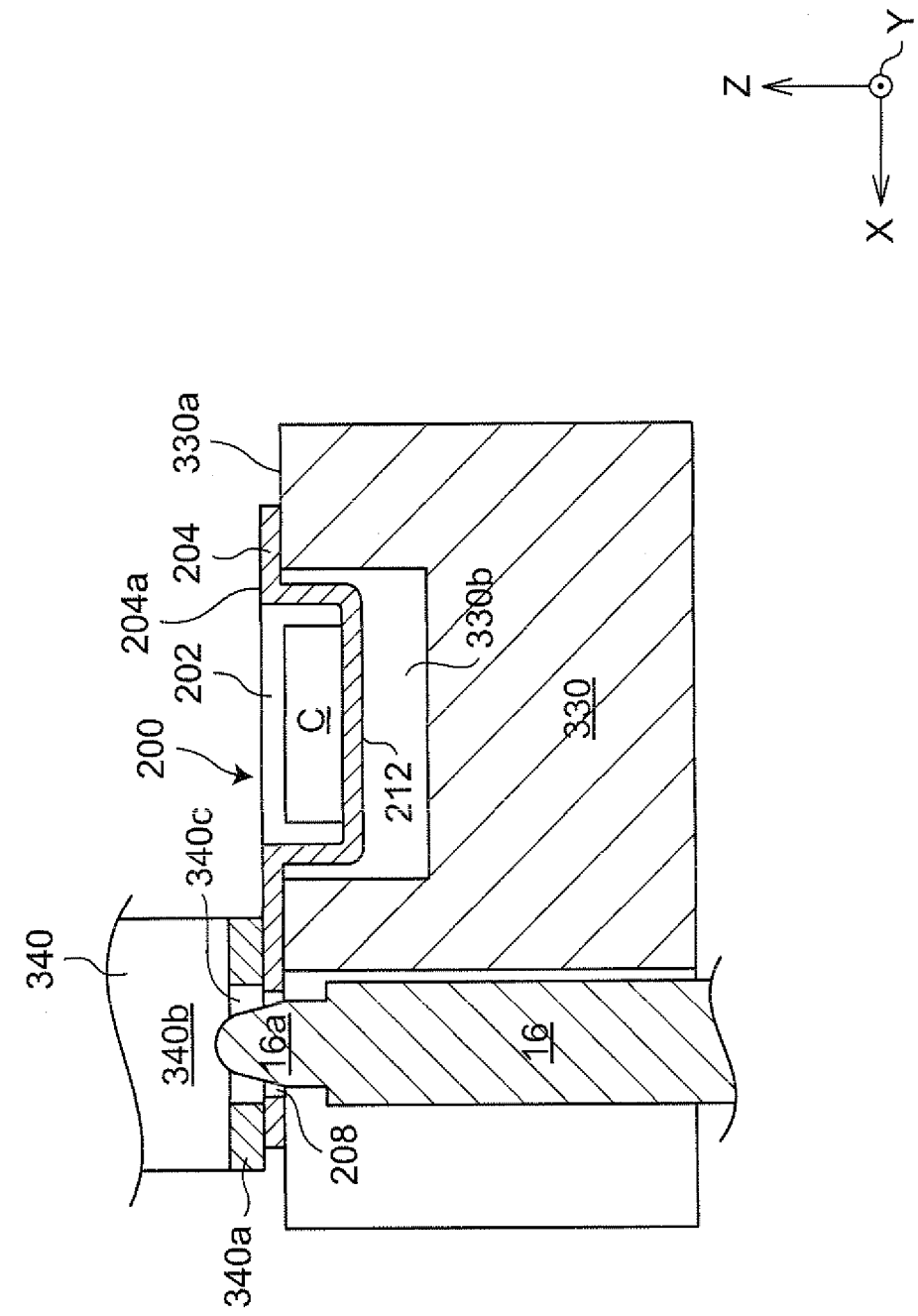
FIG. 15 is a section taken along line B-B shown in FIG. 14.

As shown in FIG. 14 as a view as seen from a side of the top tape 206 of the carrier tape 200 and FIG. 15 showing a section taken along line B-B of FIG. 14, the tape facing part 340a of the plate-like biasing part 340 has a bifurcated cut-out part 340c, e.g., in shape of a letter "U" or a square bracket for avoiding contact with the teeth 16a of the sprocket wheel 16 having entered the feed holes 208 of the carrier tape 200, on downstream end thereof in the tape feeding direction A. That is, portions of the teeth 16a of the sprocket wheel 16 that protrude beyond the main surface 204a of the base tape 204 from the feed holes 208 pass through inside of the cut-out part 340c of the plate-like biasing part 340. The cut-out part 340c makes it possible for the tape facing part 340a of the plate-like biasing part 340 to press against the tape guide part 330 portions of the carrier tape 200 on both sides in the tape width direction of the feed holes 208 in a state in which the portions of the teeth 16a of the sprocket wheel 16 protrude from the main surface 204a of the base tape 204. This results in more stable engagement of the teeth 16a of the sprocket wheel 16 with the feed holes 208 of the carrier tape 200 and attainment of stable feeding performance of the sprocket wheel 16 for the carrier tape 200.

As shown in FIGS. 14 and 15, the tape facing part 340a of the plate-like biasing part 340 presses against the tape guide part 330 the portions of the carrier tape 200 on both the sides in the tape width direction of the feed holes 208 in the state in which the teeth 16a of the sprocket wheel 16 have entered therein at least partially. Alternatively, the tape facing part 340a of the plate-like biasing part 340 may press against the tape guide part 330 a portion of the carrier tape 200 on one side in the tape width direction of the feed holes 208. In this configuration, the tape facing part 340a of the plate-like biasing part 340 preferably presses against the tape guide part 330 a portion on a recesses 202-side of the feed holes 208 in the tape width direction, i.e., the side closer to center of the tape width of the feed holes 208. By the press against the tape guide part 330 of at least the portion of the carrier tape 200 on the side of the feed holes 208 that is closer to the center thereof in the tape width direction, the carrier tape 200 is stably pressed against the tape guide part 330, so that the feed holes 208 can be engaged with the teeth 16a of the sprocket wheel 16.

As shown in FIGS. 14 and 15, the tape facing part 340a of the plate-like biasing part 340 does not press the whole tape width of the carrier tape 200 against the tape guide part 330 but presses vicinity of the feed holes 208 therein against the tape guide part 330 so as to decrease tape feeding resistance for the carrier tape 200 in the tape feeding direction A. On condition that the tape feeding resistance is not so problematic because of the tape thickness (e.g., large thickness) of the carrier tape 200, the tape facing part 340a of the plate-like biasing part 340 may press the whole tape width of the carrier tape 200 against the tape guide part 330.

The plate-like biasing part of the component supplying apparatus in accordance with the embodiment of the invention is not limited to the plate-like biasing part 340 that is mounted on the body part 312 of the component supplying apparatus 300 and that has the cantilever-like tape facing part 340a extending to the vicinity of the entrance of the facing region between the tape press block 32 and the tape guide part 330 as shown in FIG. 13. For instance, a portion of the tape facing part 340a may be inserted into a gap in the facing region between the tape press block 32 and the tape guide part 330. In this configuration, however, it is necessary to prevent the tape facing part 340a from entering the holding region A1 between the tape press block 32 and the tape guide part 330 where the carrier tape 200 is held. The plate-like biasing part may be mounted on the cover part 34 and have a tape facing part extending toward the upstream side of the tape feeding direction A in vicinity of the entrance of the facing region. In a broad sense, namely, shape of the plate-like biasing part of the component supplying apparatus in accordance with the embodiment of the invention does not matter as long as the plate-like biasing part has a tape facing part that faces the carrier tape (the main surface side of the base tape) on the tape guide part and a base part that biases the tape facing part toward the tape guide part.

The invention can be applied to any component supplying apparatus as long as the apparatus supplies components with use of a carrier tape.

The invention claimed is:
1. A component supplying apparatus for feeding in a tape length direction a carrier tape having a base tape having recesses for accommodating components, and a top tape pasted on the base tape so as to cover the recesses while allowing removal of the top tape from the carrier tape, the component supplying apparatus comprising:
 a tape guide part for facing a reverse surface of the base tape that is opposed to a main surface on which the top tape is pasted and guiding the carrier tape toward a top tape removing position,
 a blade having an edge for entering between the top tape and the base tape from a front end side of the carrier tape fed in a tape feeding direction at the top tape removing position,
 a first tape press part positioned at an upstream side of the top tape removing position in the tape feeding direction and facing the carrier tape on the tape guide part,
 a first biasing part for directly or indirectly biasing the first tape press part together with the blade toward the tape guide part with the carrier tape held between the tape guide part and the first tape press part so as to allow the carrier tape to be moved in the tape feeding direction, the carrier tape entering from the side of an entrance of a facing region where the tape guide part and the first tape press part face each other on a tape path of the carrier tape, and attaining positioning of the carrier tape in a tape thickness direction relative to the edge of the blade biased together with the first tape press part toward the tape guide part, a sprocket wheel for rotating while engaging feed holes of the carrier tape so as to wedge the carrier tape in the tape feeding direction between the tape guide part and the first tape press part holding the carrier tape, a second tape press part positioned alongside the sprocket wheel and on the side of the entrance of the facing region between the tape guide part and the first tape press part that hold the carrier tape, and facing the main surface of the base tape on the tape guide part, and a second biasing part for biasing the second tape press part toward the tape guide part to press the carrier tape against the tape guide part so as to allow the carrier tape to be moved in the tape feeding direction;

wherein the facing region between the tape guide part and the first tape press part includes a tape holding region in which the carrier tape is held between the tape guide part and the first tape press part and a tape introducing region in which a distance between the tape guide part and the first tape press part increases from the tape holding region toward the upstream side of the tape feeding direction; and wherein the sprocket wheel is configured such that teeth of the sprocket wheel start to engage with the feed holes of the carrier tape in the tape introducing region of the facing region where the tape guide part and the first tape press part face each other on the tape path, and disengage from the feed holes in the tape holding region on a downstream side of the tape introducing region in the tape feeding direction.

2. The component supplying apparatus according to claim 1, wherein the second tape press part is a freely rotatable roller having an outer peripheral surface positioned to come into contact with the carrier tape.

3. The component supplying apparatus according to claim 1, further comprising a plate-like biasing part placed above the tape guide part, the plate-like biasing part comprising:
 a tape facing part serving as the second tape press part facing the main surface of the base tape on the tape guide part, and
 a base part serving as the second biasing part for biasing the tape facing part toward the tape guide part.

4. The component supplying apparatus according to claim 3, wherein the plate-like biasing part is configured such that a portion of the tape facing part of the plate-like biasing part faces a portion of the main surface of the base tape on at least one side in the tape width direction of the feed holes in which the teeth of the sprocket wheel are to at least partially enter.

5. The component supplying apparatus according to claim 1, wherein the blade and the top tape removing position are located above the sprocket wheel.

6. A component supplying method for feeding in a tape length direction a carrier tape having a base tape having recesses for accommodating components, and a top tape pasted on the base tape so as to cover recesses while allowing removal of the top tape from the carrier tape, the component supplying method comprising:
 guiding the carrier tape toward a sprocket wheel for wedging the carrier tape in a tape feeding direction between a first tape press part and a tape guide part holding the carrier tape at an upstream side of a top tape removing position in the tape feeding direction, while the carrier tape follows the tape guide part with the tape guide part facing a reverse surface of the base tape that is opposed to a main surface on which the top tape is pasted,
 engaging feed holes of the carrier tape with teeth of the sprocket wheel while pressing the carrier tape against the tape guide part so as to allow the carrier tape to be moved in the tape feeding direction by use of a second tape press part facing the main surface of the base tape on the tape guide part at a position alongside the sprocket wheel and on a side of an entrance of a facing region where the first tape press part and the tape guide part face each other,
 rotating the sprocket wheel with the teeth engaging the feed holes of the carrier tape to wedge the carrier tape between the first tape press part directly or indirectly biased toward the tape guide part and the tape guide part so as to position the carrier tape in tape thickness direction, and
 making an edge of a blade relatively enter between the top tape and the base tape from a front end side of the carrier tape moving in the tape feeding direction in a state in which positioning in the tape thickness direction is attained by holding the carrier tape between the first tape press part and the tape guide part;
 wherein the facing region between the tape guide part and the first tape press part includes a tape holding region in which the carrier tape is held between the tape guide part and the first tape press part and a tape introducing region in which a distance between the tape guide part and the first tape press part increases from the tape holding region toward the upstream side of the tape feeding direction; and
 wherein teeth of the sprocket wheel start to engage with the feed holes of the carrier tape in the tape introducing region of the facing region where the tape guide part and the first tape press part face each other on the tape path, and disengage from the feed holes in the tape holding region on a downstream side of the tape introducing region in the tape feeding direction.

7. The component supplying method according to claim 6, wherein the blade and the top tape removing position are located above the sprocket wheel.

* * * * *